US009859515B2

(12) United States Patent
Hammond et al.

(10) Patent No.: US 9,859,515 B2
(45) Date of Patent: Jan. 2, 2018

(54) METHODS FOR PRODUCING THIN FILM CHARGE SELECTIVE TRANSPORT LAYERS

(71) Applicants: Alliance for Sustainable Energy, LLC, Golden, CO (US); SolarWindow Technologies, Inc., Columbia, MD (US)

(72) Inventors: Scott Ryan Hammond, Denver, CO (US); Dana C. Olson, Boulder, CO (US); Marinus Franciscus Antonius Maria van Hest, Lakewood, CO (US)

(73) Assignees: Alliance for Sustainable Energy, LLC, Golden, CO (US); SolarWindow Technologies, Inc., Columbia, MD (US)

( * ) Notice: Subject to any disclaimer, the term of this patent is extended or adjusted under 35 U.S.C. 154(b) by 379 days.

(21) Appl. No.: 14/200,315

(22) Filed: Mar. 7, 2014

(65) Prior Publication Data
US 2014/0256081 A1    Sep. 11, 2014

Related U.S. Application Data

(60) Provisional application No. 61/774,200, filed on Mar. 7, 2013.

(51) Int. Cl.
*H01L 51/00*    (2006.01)
*H01L 51/42*    (2006.01)

(52) U.S. Cl.
CPC ...... *H01L 51/4253* (2013.01); *H01L 51/0026* (2013.01); *H01L 51/0036* (2013.01);
(Continued)

(58) Field of Classification Search
None
See application file for complete search history.

(56) References Cited

U.S. PATENT DOCUMENTS 5,132,140 A    7/1992 Goda et al.
5,711,803 A    1/1998 Pehnt et al.
(Continued)

FOREIGN PATENT DOCUMENTS

JP    2011/027549    3/2012
WO    WO 2007001468    1/2007
(Continued)

OTHER PUBLICATIONS

Lee et al., "Optimization of an Electron Transport Layer to Enhance the Power Conversion Efficiency of Flexible Inverted Organic Solar Cells," Nanoscale Research Letters, vol. 5, Issue 12, Aug. 31, 2010, pp. 1908-1912.
(Continued)

*Primary Examiner* — Jack Chen
(74) *Attorney, Agent, or Firm* — Robert G. Pittelkow

(57) ABSTRACT

Methods for producing thin film charge selective transport layers are provided. In one embodiment, a method for forming a thin film charge selective transport layer comprises: providing a precursor solution comprising a metal containing reactive precursor material dissolved into a complexing solvent; depositing the precursor solution onto a surface of a substrate to form a film; and forming a charge selective transport layer on the substrate by annealing the film.

20 Claims, 14 Drawing Sheets

(52) U.S. Cl.
CPC .... *H01L 51/0047* (2013.01); *H01L 2251/303* (2013.01); *Y02E 10/549* (2013.01); *Y02P 70/521* (2015.11)

(56) References Cited

U.S. PATENT DOCUMENTS

| | | | |
|---|---|---|---|
| 5,776,254 | A | 7/1998 | Yuuki et al. |
| 6,126,740 | A | 10/2000 | Schulz et al. |
| 6,436,305 | B1 | 8/2002 | Schulz et al. |
| 6,830,778 | B1 | 12/2004 | Schulz et al. |
| 6,951,666 | B2 | 10/2005 | Kodas et al. |
| 6,951,694 | B2 | 10/2005 | Thompson et al. |
| 7,014,979 | B2 | 3/2006 | Byun et al. |
| 7,208,872 | B2 | 4/2007 | Miyadera |
| 7,535,017 | B2 | 5/2009 | Wittmann et al. |
| 7,799,990 | B2 | 9/2010 | Marks et al. |
| 8,093,491 | B2 | 1/2012 | Sridharan et al. |
| 8,641,931 | B2 | 2/2014 | Ginley et al. |
| 2004/0005412 | A1 | 1/2004 | Byun et al. |
| 2004/0261839 | A1 | 12/2004 | Gee et al. |
| 2005/0078158 | A1 | 1/2005 | Magdassi et al. |
| 2005/0277274 | A1 | 12/2005 | Karkkainen |
| 2006/0001726 | A1 | 1/2006 | Kodas et al. |
| 2006/0043346 | A1 | 3/2006 | Kodas et al. |
| 2006/0060757 | A1 | 3/2006 | Takiba et al. |
| 2006/0081840 | A1* | 4/2006 | Mori ............... H01L 51/105 257/40 |
| 2006/0208257 | A1 | 9/2006 | Branz et al. |
| 2006/0231804 | A1 | 10/2006 | Wang et al. |
| 2007/0163634 | A1 | 7/2007 | Wada et al. |
| 2008/0003364 | A1 | 1/2008 | Ginley et al. |
| 2008/0032443 | A1 | 2/2008 | Wu et al. |
| 2008/0145520 | A1 | 6/2008 | Yumoto |
| 2008/0193793 | A1 | 8/2008 | Johannes et al. |
| 2009/0044855 | A1 | 2/2009 | Irwin et al. |
| 2009/0188556 | A1 | 7/2009 | Castillo et al. |
| 2009/0229670 | A1 | 9/2009 | Kitamura et al. |
| 2009/0280624 | A1 | 11/2009 | Curtis et al. |
| 2009/0283141 | A1 | 11/2009 | Bentzen et al. |
| 2009/0293956 | A1 | 12/2009 | Kitamura |
| 2010/0012178 | A1 | 1/2010 | Yang et al. |
| 2010/0089636 | A1 | 4/2010 | Ramadas et al. |
| 2010/0163810 | A1 | 7/2010 | Ginley et al. |
| 2010/0209594 | A1 | 8/2010 | Curtis et al. |
| 2010/0300522 | A1 | 12/2010 | Ginley et al. |
| 2011/0108116 | A1 | 5/2011 | Kang et al. |
| 2011/0223433 | A1* | 9/2011 | Hammond ......... C23C 18/1216 428/448 |
| 2012/0015147 | A1 | 1/2012 | Maa et al. |
| 2012/0060910 | A1 | 3/2012 | Schoenfeld et al. |
| 2012/0094019 | A1 | 4/2012 | Inaba et al. |
| 2012/0132272 | A1* | 5/2012 | Steirer ............... H01L 51/4253 136/256 |
| 2012/0216870 | A1 | 8/2012 | So et al. |
| 2012/0288991 | A1 | 11/2012 | Abed et al. |
| 2013/0061931 | A1 | 3/2013 | Lim et al. |
| 2014/0134781 | A1 | 5/2014 | Steirer et al. |

FOREIGN PATENT DOCUMENTS

| | | |
|---|---|---|
| WO | WO 2009059302 | 5/2009 |
| WO | WO 2010140980 | 12/2010 |

OTHER PUBLICATIONS

Armstrong, et al., "Interface modification of ITO thin films: organic photovoltaic cells", Thin Solid Films, vol. 445, No. 2, 2003, pp. 324-352.
Bailey, et al., "Nickel Oxide as an Inorganic Hole Transport Layer in Organic Photovoltaics", American Physical Society, Fall 2009 Meeting of the Four Corners Section of the APS, Oct. 23-24, 2009, abstract #D1.050, http://meetings.aps.org/link/BAPS.2009.4CF.D1.50.
Ballif, et al., "Silver-thick-film contacts on highly doped n-type silicon emitters; Structural and electronic properties of the interface", Applied Physics Letters, vol. 82, Issue 12, Mar. 24, 2003, pp. 1878-1880.
Berry, et al., "Mixed Metal Oxide Systems for Organic Photovoltaics", IEEE, Photovoltaic Specialists Conference, Jun. 7-12, 2009, pp. 1448-1451.
Berry, et al., "Surface treatment of NiO hole transport layers for organic solar cells," IEEE Journal of Selected Topics in Quantum Electronics, vol. 16, No. 6, Nov./Dec. 2010, pp. 1649-1655.
Blouin, et al., "A low-bandgap poly(2,7 carbazole) derivative for use in high-performance solar cells", Advanced Materials, vol. 19, No. 17, Sep. 2007, pp. 2295-2300.
Blouin, et al., "Toward a rational design of poly(2,7-carbazole) derivatives for solar cells", Journal of the American Chemical Society, vol. 130, No. 2, Jan. 2008, pp. 732-742.
Brabec, et al., "Solution-Processed Organic Solar Cells", MRS Bulletin, vol. 33, Jul. 2008, pp. 670-675.
Braun, et al., "Energy-level alignment at organic/metal and organic/organic interfaces," Advanced Materials, vol. 21 (14-15), Apr. 2009, pp. 1450-1472.
Calvert, "Inkjet Printing for Materials and Devices," Chemical Materials, vol. 13, Issue 10, Oct. 2001, pp. 3299-3305.
Campaniello et al., "Preparation of textured alumina films by the sol-gel route", Journal Material Research, vol. 10, No. 2, Feb. 1995, pp. 297-301.
Chen, et al., "Polymer solar cells with enhanced open-circuit voltage and efficiency", Nature Photonics, vol. 3, No. 11, Nov. 2009, pp. 649-653.
Choi, et al., "Diamond-like carbon as a buffer layer in polymeric electroluminescent device", Thin Solid Films, vol. 483, No. 1-2, 2005 pp. 351-357.
Curtis, "Metallizations by Direct-Write Inkjet Printing", 2001, NREL/CP-520-31020, pp. 1-4, National Renewable Energy Laboratory, Golden, Colorado USA.
De Jong, et al., "Stability of the interface between indium-tin-oxide and poly(3,4-ethylenedioxythiophene)/ poly(styrenesulfonate) in polymer light-emitting diodes", Applied Physics Letters, vol. 77, Issue 14, Oct. 2000, pp. 2255-2257.
Denisov et al., "Study of the interaction of organometallic compounds with electron donors by the PMR method. 2. Complex formation of diethylzinc with tetrahydrofuran, diethyl ether, propylene oxide, and propylene sulfide," Bulletin of the Academy of Sciences of the USSR, Division of chemical science, vol. 24, Issue 12, Dec. 1975, pp. 2595-2597.
Di Risio, et al., "Piezoelectric Ink-Jet Printing of Horseradish Peroxidase: Effect of Ink Viscosity Modifiers on Activity", Macromolecular Rapid Communications, vol. 28, Issue 18-19, Sep. 28, 2007, pp. 1934-1940.
Erlat et al., "SiOx Gas Barrier Coatings on Polymer Substrates: Morphology and Gas Transport Considerations", Journal of Physical Chemistry, vol. 103, No. 29, Jul. 22, 1999, pp. 6047-6055.
Erler et al., "Multi Layer Materials for the Encapsulation of Thin Film Modules", 3rd World Conference on Photovoltaic Energy Conversion, May 11-18, 2003, Osaka Japan.
George et al., "Surface Chemistry for Atomic Layer Growth", Journal of Physical Chemistry, vol. 100, No. 31, Aug. 1, 1996, pp. 13121-13131.
Ginley et al, "Inkjet Direct Write Solar Cells", Dec. 7, 2005, Contract No. RD-93, Report No. 1, National Renewable Energy Laboratory, Golden, Colorado USA.
Ginley et al, "Inkjet Direct Write Solar Cells", Feb. 6, 2006, Contract No. RD-93, Report No. 3, National Renewable Energy Laboratory, Golden, Colorado USA.
Graff et al., Mechanisms of vapor permeation through multilayer barrier films: Lag time versus equilibrium permeation:, J. Appl. Phys. vol. 96, No. 4, Aug. 15, 2004.
Greczynski et al., "Photoelectron spectroscopy of thin films of PEDOT-PSS conjugated polymer blend: a mini-review and some new results", Journal of Electron Spectroscopy and Related Phenomena, vol. 121(1-3), Dec. 2001, pp. 1-17.
Hains et al., "High-efficiency hole extraction/electron-blocking layer to replace poly(3, 4-ethylenedioxythiophene:poly(styrene

(56) References Cited

OTHER PUBLICATIONS sulfonate) in bulk-heterojunction polymer solar cells", Applied Physics Letters, vol. 92, Issue 2, Jan. 2008, pp. 0235041-0235043.
Halls, et al., "Efficient photodiodes from interpenetrating polymer networks", Letters to Nature, vol. 376, Aug. 10, 1995, pp. 498-500.
Heliatek Press Release, "Heliatek achieves new world record for organic solar cells with certified 9.8% cell efficiency", accessed Sep. 24, 2013.
Hoornstra et al., "Lead Free Metallisation Paste for Crystalline Silicon Solar Cells: From Model to Results", Conference Record of the Thirty-First IEEE Photovoltaic Specialists Conference, Orlando, Florida, Jan. 3-7, 2005, pp. 1293-1296.
Hoornstra, et al., "Lead free metallisation for silicon solar cells: results from the EC2 Contact project", 20th European Photovoltaic Solar Energy Conference, Jun. 6-10, 2005, Barcelona, Spain.
Hu et al., "Low-temperature preparation of photocatalytic $TiO_2$ thin films from anatase sols", Journal of Crystal Growth, vol. 274, No. 3-4, Jun. 3, 2005, pp. 563-668.
Hwang, et al., "Spectroscopic study on sputtered PEDPT-PSS: role of surface PS layer", Organic Electronics, vol. 7, Issue 5, Oct. 2006, pp. 387-396.
Irwin, et al., "p-Type semiconducting nickel oxide as an efficiency-enhancing anode interfacial layer in polymer bulk-heterojunction solar cells", Proceedings of Natl Acad Sci U S A, Feb. 26, 2005 105(8); 2783-2787.
Jang, et al, "Influence of Fluid Physical Properties on Ink-Jet Printability", Langmuir, vol. 25, Issue 5, Mar. 3, 2009, pp. 2629-2635.
Jiang, et al., "Ethylene glycol-mediated synthesis of metal oxide nanowires", Journal of Material Chemistry, vol. 14, Jan. 21, 2004, pp. 694-703.
Jorgensen, et al., "Stability/degradation of polymer solar cells", Solar Energy Materials & Solar Cells, vol. 92, No. 7, Jul. 2008, pp. 686-714.
Kang, "Water-Based Ink-Jet Ink I. Formulation", Journal of Imaging Science, May/Jun. 1991, vol. 35, No. 3, pp. 179-188, IS&T—The Society for Imaging Science and Technology.
Kang, "Water-Based Ink-Jet Ink. II Characterization", Journal of Imaging Science, May/Jun. 1991, vol. 35, No. 3, pp. 189-194, IS&T—The Society for Imaging Science and Technology.
Kang, "Water-Based Ink-Jet Ink. III Performance Studies", Journal of Imaging Science, May/Jun. 1991, vol. 35, No. 3, pp. 195-201, IS&T—The Society for Imaging Science and Technology.
Kawano, et al., "Degradation of organic solar cells due to air exposure," Solar Energy Materials and Solar Cells, vol. 90, Issue 20, Dec. 15, 2006, pp. 3520-3530.
Kaydanova et al., "Direct Write Contacts for Solar Cells, Conference Paper", NRELCP-520-37524, 31st IEEE Photovoltaics Specialist Conference and Exhibition, Lake Buena Vista, Florida, Jan. 3-7, 2005.
Kaydanova et al., "Ink Jet Printing Approaches to Solar Cell Contacts", NREL/CP-520-33594, National Center for Photovoltaics and Solar Program Review Meeting, Denver, Colorado, Mar. 24-23, 2033.
Leterrier et al., "Mechanical properties of transparent functional thin films for flexible displays", Society of Vacuum Coaters, 46th Annual Technical Conference Proceedings, 2003, 505/856-7188, pp. 1-6.
Lewis et al., "Thin-Film Permeation-Barrier Technology for Flexible Organic Light-Emitting Devices", IEEE Journal of Selected Topics in Quantum Electronics, vol. 10, No. 1, Jan./Feb. 2004, pp. 45-57.
Lewis, et al., "Powering the planet: Chemical challenges in solar energy utilization", Proc. Nat. Acad. Sci., vol. 103, No. 43, Oct. 24, 2006, pp. 15729-15735.
Li, et al., "High-efficiency solution processable polymer photovoltaic cells by self-organization of polymer blends", Nature Materials, vol. 4, Nov. 2005, pp. 864-868.
Li, et al., "Solution-Processable Graphene Oxide as an Efficient Hole Transport Layer in Polymer Solar Cells", ACSNANO, vol. 4, No. 6, Jun. 2010, pp. 3169-3174.
Lin, et al., "Effect of fabrication process on the microstructure and the efficiency of organic light-emitting diode", Organic Electronics, vol. 10, No. 3, 2009, pp. 459-464.
Lloyd, et al., "Impact of contact evolution on the shelf life of organic solar cells", Journal of Materials Chemistry, vol. 19, No. 41, Nov. 7, 2009, pp. 7569-7780.
Lyon, et al., "Photoemission study of the poly(3-hexylthiophene)/Au interface", Applied Physics Letters, vol. 88, Issue 22, May 2006, pp. 222109-1-3.
Mashford, et al., "All-inorganic quantum-dot light-emitting devices formed via low-cost wet-chemical processing", Journal of Material Chemistry, vol. 20, No. 1, 2010, pp. 167-172.
Moule, et al., "The effect of active layer thickness and composition on the performance of bulk-heterojunction solar cells", Journal of Applied Physics, vol. 100, Issue 9, Nov. 2009, pp. 0945031-0945037.
Meyers et al., "Aqueous Inorganic Inks for Low-Temperature Fabrication of ZnO TFTs", J. Am. Chem. Soc. 2008, vol. 130, pp. 17603-17609.
Nisato et al., "Evaluating High Performance Diffusion Barriers: the Calcium Test", 21st Annual Asia Display, 8th International Display Workshop, Nagoya, Japan, Oct. 2001.
Park, et al., " Bulk heterojunction solar cells with internal quantum efficiency approaching 100%", Nature Photonics, vol. 3, No. 5, May 2009, pp. 297-302.
Pettersson, et al., "Modeling photocurrent action spectra of photovoltaic devices based on organic thin films", Journal of Applied Physics, vol. 86, Issue 1, Jul. 1999, pp. 487-496.
Potscavage, Jr., et al., "Origin of the open-circuit voltage in multilayer heterojunction organic solar cells", Applied Physics Letters, vol. 93, Issue 19, Nov. 2008, pp. 1933081-1933082.
Rivkin et al., "Direct Processing for Photovoltaic Cells", 12th Workshop on Crystalline Silicon Solar Cell Materials and Processes, Aug. 2020, National Renewable Energy Laboratory/BK-520-32717, pp. 1326-1329.
Roman, et al., "Polymer diodes with high rectification", Applied Physics Letters, vol. 75, Issue 22, Nov. 29, 1999, pp. 3557-3559.
Roth et al., "Properties of zinc oxide films prepared by the oxidation of diethyl zinc," Journal of Applied Physics, vol. 52, No. 11, Nov. 1981, pp. 6685-6692.
Sariciftci, et al., "Photoinduced electron transfer from a conducting polymer to Buckminsterfullerene", Science, vol. 258, Nov. 27, 1992, pp. 1474-1476.
Scharber, et al., "Design rules for donors in bulk-heterojunction solar cells—towards 10% energy-conversion efficiency", Advanced Materials, vol. 18, No. 6, Mar. 2006, pp. 789-794.
Schubert, et al., "Current Transport Mechanism in Printed AG Thick Film Contact to an N-Type Emitter of a Crystalline Silicon Solar Cell", 19th European Solar Energy Conference and Exhibition, Jun. 7-11, 2004, Paris, France.
Shaheen, et al., "2.5% efficient organic plastic solar cells", Applied Physics Letters, vol. 78, Issue 6, Feb. 5, 2001, pp. 841-843.
Shaheen, et al., "Fabrication of bulk heterojunction plastic solar cells by screen printing", Applied Physics Letters, vol. 79, No. 18, Oct. 29, 2001, pp. 2996-2998.
Shaheen, et al., "Organic-Based Photovoltaics: Toward Low-Cost Power Generation", MRS Bulletin, vol. 10, Jan. 2005, pp. 10-15.
Slooff et al., "Influence of the Relative Humidity on the Performance of Polymer/$TiO_2$ Photovoltaic Cells," Advanced Functional Materials, vol. 15, No. 4, Apr. 2005, pp. 689-694.
Sridharan, et al., "Lead Free Silver Front Contact Pastes for $SiN_x$ Coated Polycrystalline Silicon Solar Cells," International PVSEC-15 Shanghai, China, 2005, pp. 1-2.
Steirer, et al., "Ultrasonically sprayed and inkjet printed thin film electrodes for organic solar cells", Thin Solid Films, vol. 517, No. 8, 2009, pp. 2781-2786.
Steirer, "Solution deposited NiO thin-films as hole transport layers in organic photovoltaics", Organic Electronics, vol. 11, Issue 8, Aug. 2010, pp. 1414-1418.

(56) References Cited

OTHER PUBLICATIONS

Steirer, et al., "Enhanced Efficiency in Plastic Solar Cells via Energy Matched Solution Processed NiOx Interlayers", Advanced Energy Materials, vol. 1, 2011, pp. 813-820.
Tengstedt, et al., "Fermi-level pinning at conjugated polymer interfaces", Applied Physics Letters, vol. 88, Issue 6, Jan. 2006, pp. 0535021-0535023.
Vitoratos, et al., "Thermal degradation mechanisms of PEDOT:PSS", Organic Electronics, vol. 10, Issue 1, Feb. 2009, pp. 61-66.
Waldauf, et al., "Physics of organic bulk heterojunction devices for photovoltaic applications," Journal of Applied Physics, vol. 99, Issue 10, May 2006, pp. 1045031-1045036.
Wang, et al., "Influence of PEDOT:PSS buffer layer on the performance of organic photocoupler," Optoelectronics Letters, vol. 5, No. 3, May 1, 2009, pp. 0173-0176.
Weaver, et al., "Organic light-emitting devices with extended operating lifetimes on plastic substrates", Applied Physics Letters, vol. 81, No. 16, Oct. 14, 2002, pp. 2929-2931.
Wu et al., "Surface modification of indium tin oxide by plasma treatment: an effective method to improve the efficiency, brightness, and reliability of organic light emitting devices," Applied Physics Letters, vol. 70, Issue 11, Mar. 1997, pp. 1348-1350.
Wu et al., "Assembly of Conducting Polymer/Metal Oxide Multilayer in One Step", Synthetic Metals 102, 1999, pp. 1286-1269.
Xu, et al., "Energy level alignment of poly(3-hexylthiophene):[6,6]-phenyl C[sub61] butyric acid methyl ester bulk heterojunction", Applied Physics Letters, Vol, 95, Issue 1, May 2009, pp. 013301-013303.
Yancey, "Direct Write Metallizations with Organometallic Inks," DOE Energy Research Undergraduate Laboratory Fellowship, National Renewable Energy Laboratory, Golden, Colorado, Aug. 18, 2000, pp. 1-19.
Yin et al., "Mild solution synthesis of zinc oxide films with superhydrophobicity and superdydrophilicity", Journal Material Chemistry, vol. 15, No. 42, Nov. 21, 2005, pp. 4584-4587.
Yu, et al., "Polymer photovoltaic cells: enhanced efficiencies via a network of internal donor-acceptor heterojunctions", Science, vol. 270, Dec. 15, 1995, pp. 1789-1791.
Yun, et al., "Pentacene Thin-Film Transistor with NiOx as a Source/Drain Electrode Deposited with Sputtering", Journal of the Electrochemical Society, vol. 155, No. 11 (2008), pp. H899-H902.
Zhang, et al., "Energy level alignment and morphology of interfaces between molecular and polymeric organic semiconductors", Organic Electronics, vol. 8, Issue 5, Oct. 2007, pp. 606-614.
Zhao, et al., "An inverted organic solar cell with an ultrathin Ca electron-transporting layer and MoO[sub 3] hole-transporting layer", Applied Physics Letters, vol. 92, Issue 15, Oct. 2009, pp. 1533041-1533043.
International Search Report and Written Opinion, dated Jan. 6, 2009, for International Application PCT/US08/82261.
International Search Report and Written Opinion dated Jun. 18, 2014, for International Application PCT/US14/21665.
Beek et al., "Hybrid Poly-Inorganic Photovoltaic Cells," Hybrid Nanocomposites for Nanotechnology, Springer Science+Business Media, LLC, 2009, New York, Ny, Chapter 8, pp. 321-385
Beek et al., "Hybrid Solar Cells Using a Zinc Oxide Precursor and a Conjugated Polymer," Advanced Functional Materials, vol. 15, Issue 10, Oct. 2005, pp. 1703-1707.
Lloyd et al., "Influence of the hole-transport layer on the initial behavior and lifetime of inverted organic photovoltaics," Solar Energy Materials & Solar Cells, vol. 95, Issue 5, May 2011, pp. 1382-1388.
Oosterhout et al., "Hybrid Polymer Solar Cells from Zinc Oxide and Poly-(3-hexylselenohhene)," Journal of Physical Chemistry C, vol. 115, Issue 38, Sep. 29, 2011, pp. 18901-18908.
Pasquarelli et al., "Solution processing of transparent conductors: from flask to film," The Royal Society of Chemistry, vol. 40, Issue 11, Nov. 1, 2011, pp. 5406-5441.
Boschloo et al., "Spectroelectrochemistry of nanostructured NiO", Journal of Physical Chemistry B, 2001, vol. 105, pp. 3039-3044.
Kumagai et al., "Preparation and characteristics of nickel oxide thin film by controlled growth with sequential surface chemical reactions", Journal of Material Science Letters, 1996, vol. 15, pp. 1081-1083.
Lee et al., "Structural, optical, and electrical properties of p-type NiO films and composite $TiO_2$/NiO electrodes for solid-state dye-sensitized solar cells", Applied Surface Science, 2009, vol. 255, pp. 4658-4663.
Nakaoka et al., "Semiconductor and electrochromic properties of electrochemically deposited nickel oxide films", Journal of Electroanalytical Chemistry, 2004, vol. 571, pp. 93-99.
Ohya et al., "Electrical properties of p-n contact with oxide semiconductor thin films fabricated by liquid phase method", Materials Science and Engineering, 1998, vol. B54, pp. 55-59.
Vera et al., "Preparation and characterization of Eosin B- and Erythrosin J-sensitized nanostructures NiO thin film photocathodes", Thin Solid Films, 2005, vol. 490, pp. 182-188.
Zayim et al., "Sol-gel deposited nickel oxide films for electrochromic applications", Solar Energy Materials & Solar Cells, 2008, vol. 92, pp. 164-169.
Lin et al., "High-efficiency inverted polymer solar cells with solution-processed metal oxides," Solar Energy Materials & Solar Cells, vol. 95, 2011, pp. 2511-2515.
EP20140760234 Extended European Search Report, dated Nov. 7, 2016, 10 pages.

\* cited by examiner

METHODS FOR PRODUCING THIN FILM CHARGE SELECTIVE TRANSPORT LAYERS

CROSS-REFERENCE TO RELATED APPLICATIONS

This application claims priority to, and the benefit of, U.S. Provisional Application No. 61/774,200, entitled "A METHOD OF PRODUCING A THIN FILM FOR USE AS AN ELECTRON- OR HOLE-TRANSPORT LAYER IN OPTOELECTRONIC DEVICES" filed on Mar. 7, 2013, which is incorporated herein by reference in its entirety.

CONTRACTUAL ORIGIN

The United States Government has rights in this invention under Contract No. DE-AC36-08GO28308 between United States Department of Energy and the Alliance for Sustainable Energy, LLC, the Manager and Operator of the National Renewable Energy Laboratory.

BACKGROUND

Optoelectronic devices are an increasingly central part of everyday life. Smart phones, computers, televisions, handheld electronics, radio-frequency ID tags (RFIDs), 'smart' appliances, photovoltaic devices, and more, include such optoelectronic devices. Examples of such devices include: displays, such as liquid crystal displays (LCDs) and organic light emitting diode displays (OLEDs); photovoltaic (PV) devices, including crystalline silicon, inorganic thin-film, and organic photovoltaic (OPV); and field-effect transistors (FETs), which are a key element in many electronic devices. The trend is to reduce the size and/or cost of these optoelectronic devices in order to enable widespread commercial adoption. Once low enough thresholds are reached for size and/or cost, such devices are expected to become nearly ubiquitous in everyday life.

In order to make these devices more cost-effective, techniques that allow high-throughput large-area manufacturing are needed to reduce the cost per unit device to reasonable levels. While optoelectronic devices are diverse, and thus the materials and manufacturing techniques involved vary quite a bit, there are a number of common elements in a variety of optoelectronic devices. Many such devices require the controlled transport of electrons and/or holes (i.e., electron vacancies) into or out of the device, in order to precisely control the flow (e.g., in FETs), separation (e.g., in PV), or recombination (e.g., in OLEDs) of such particles in the device, enabling the desired device properties. The materials used to enable such controlled flow of electrons or holes in a device are referred to as electron transport layers or hole transport layers (ETLs or HTLs), respectively. An ETL will allow the transport (flow, collection, or injection, depending on the device) of electrons, while blocking the transport of holes in a device, while a HTL will do the opposite.

While there are a variety of ETL and HTL materials used in the many various types and versions of optoelectronic devices in existence, many common transport layers are based upon metal oxide thin films. Metal oxide thin films have a number of advantages over alternative materials, such as thin polymer films and self-assembled monolayers (SAMs). Metal oxide thin films are relatively well-studied and understood materials and are generally physically, thermally, and chemically robust. The variety of metals that form useable oxides ensure a broad range of such device-important physical properties, such as n-type or p-type material, work function, conductivity, electron/hole mobility, optical transparency and reflectivity. In contrast to metal oxides, thin polymer film transport layers are generally much less well studied and understood materials, often have low mobilities, which require very thin films (~5 nm) to ensure adequate performance, and as such often have poor physical robustness. Additionally, thin polymer films are generally much less thermally stable than metal oxides. Similarly, SAM transport layers are poorly studied materials, and are not currently well understood. Their monolayer nature ensures very fragile films with high potential for pinholes/shorts and often exhibit poor thermal and chemical stability.

Metal oxide thin films can be produced via a variety of techniques, including: sputtering, chemical vapour deposition (CVD), pulsed-laser deposition (PLD), atomic layer deposition (ALD), thermal evaporation, and sol-gel chemistry methods. These techniques share a common disadvantage in that they either require a vacuum based process to enable the film deposition or they require subjecting materials to high temperatures for extended time periods. Vacuum-based process significantly increases the time and cost of depositing metal oxide thin films, as samples are pumped down to the desired vacuum levels, the deposition performed, and then the samples returned to atmospheric pressure levels. High temperature techniques, which often require temperatures in excess of 300° C., add significant cost due to the high energy demands on obtaining and maintaining such temperatures. Furthermore, such high temperatures significantly limit the range of substrates that can be used. For example, temperatures above 150° C. for extended periods prevent the use of many polymer foils, such as polyethylene terephthalate (PET) and polyethylene naphthalate (PEN), often used in high-throughput roll-to-roll manufacturing lines. Additionally, elevated temperatures tend to cause damage to any other underlying layers exposed to the high temperatures. Meanwhile, nanoparticle techniques produce materials with diminished transport and hole blocking characteristics as compared metal oxide thin films produced using the sol-gel or vacuum deposition methods, and their use is complicated by wetting and aggregation issues that hinder large-scale production.

The foregoing examples of the related art and limitations related therewith are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in referenced figures of the drawings. It is intended that the embodiments and figures disclosed herein are to be considered illustrative rather than limiting. Those skilled in the art will understand that the drawings, described herein, are for illustration purposes only. The drawings are not intended to limit the scope of the present disclosure.

DETAILED DESCRIPTION

Figure 1:
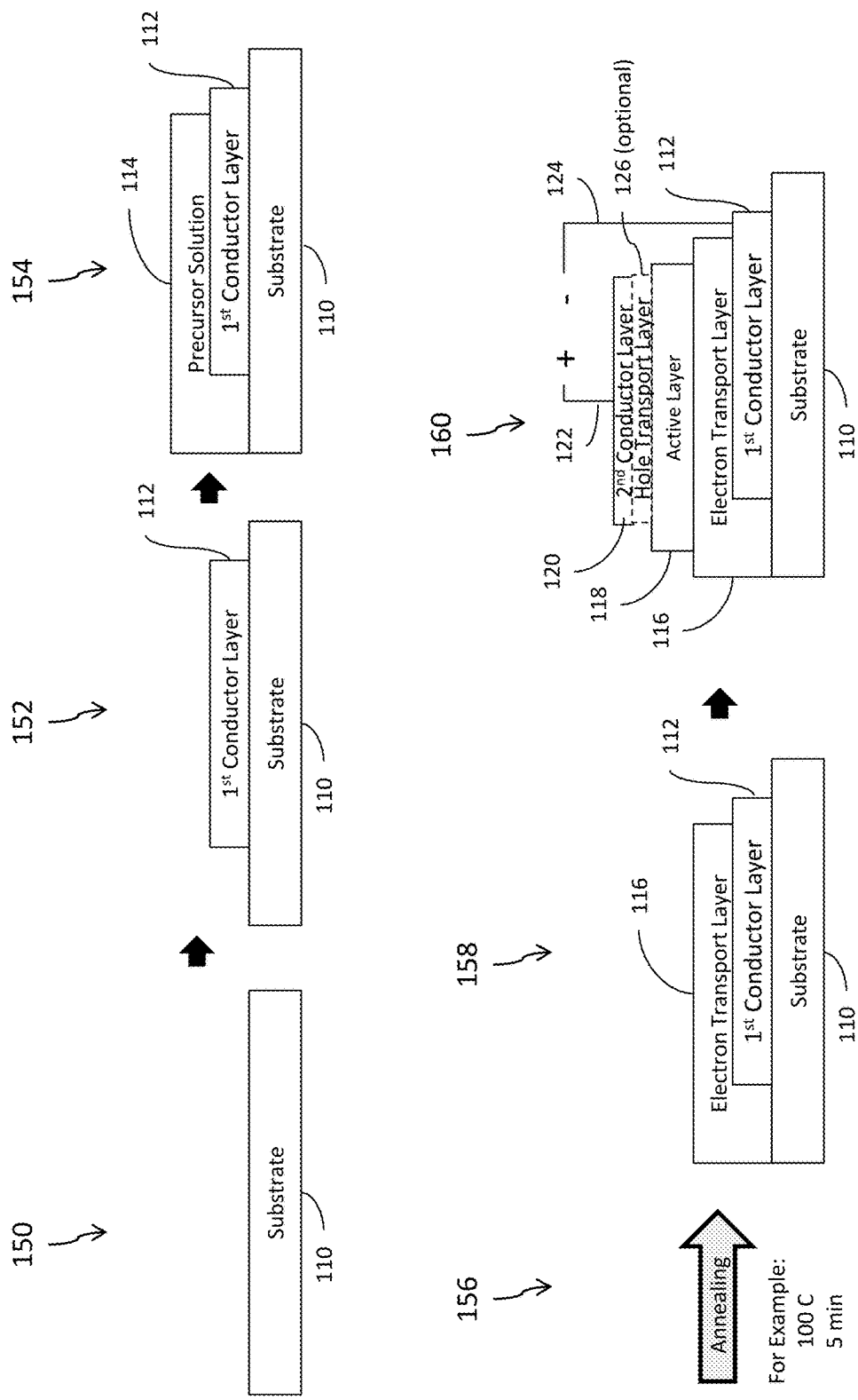
FIGS. 1, and 1A-1E illustrate fabrication of a photovoltaic device having a charge selective transport layer of one example embodiment of the present disclosure.

Embodiments of the present disclosure present low temperature solution based methods for fabrication charge selective transport layers for use, for example, in photovoltaic and other optoelectronic devices. More particularly, the present disclosure describes methods of generating thin films suitable for use as charge selective transport layers from precursor solutions. These charge selective transport layers include both electron transport layers and hole transport layers. In the various embodiments described below, precursor solutions suitable for forming charge selective transport layers may be produced by dissolving a metal containing reactive precursor material into a complexing solvent. The resulting solution is then deposited and annealed to form either an electron transport layer or a hole transport layer. As explained below, whether the charge selective transport layer functions as a hole transport layer or an electron transport layer will depend at least in part on the composition of the metal containing reactive precursor material and the location of the resulting material layer within the device.

As further detailed below, an electron transport layer is a layer formed between an active layer (such as an active semiconductor hetero junction layer) and a conductive layer designed to function as an electron emitting terminal (i.e., a cathode) for a device. The presence of an electron transport layer serves two functions: it will have a low enough work function to help provide the built-in field necessary to assist in charge collection, and it will have a proper energy level to efficiently transport electrons while blocking holes. For example, a charge selective transport layer having a work function in the range of 3-4.5 eV would be considered suitable for functioning as an electron transport layer in most applications. This range is however provided as a general guideline because how a work function is measured will cause the measured value to vary. At the same time, one of ordinary skill in the art after reading this disclosure would readily be able to determine, for their particular application, whether a resulting material layer has a work function sufficient for providing an electron transport layer.

A number of different materials can serve as an electron transport layer, including but not limited to such metal oxides as zinc oxide (ZnO) and titanium oxide ($TiO_x$) as well as caesium carbonate ($Cs_2CO_3$), thin polymer dielectrics such as poly[(9,9-bis(3'-(N,N-dimethylamino)propyl)-2,7-fluorene)-alt-2,7-(9,9-dioctylfluorene) (PFN), or self-assembled monolayers (SAMs) based on molecules such as N-propyl trimethoxysilane or aminopropyl triethoxysilane.

Similarly, and as further detailed below, a hole transport layer is a layer formed between an active layer and a conductive layer that is designed to function as the hole emitting terminal (i.e., an anode) for a device. A hole transport layer should have a high enough work function to help provide the built-in field and have proper energy levels to efficiently transport holes while blocking electrons. For example, a charge selective transport layer having a work function in the range of 4.9-6 eV would be considered suitable for functioning as a hole transport layer in most applications. This range is however provided as a general guideline because how a work function is measured will cause the measured value to vary. One of ordinary skill in the art after reading this disclosure would readily be able to determine for their particular application whether the resulting material layer has a work function sufficient for providing a hole transport layer. As such, a number of different materials can act as a hole transport layer, including but not limited to such metal oxides as: molybdenum oxide ($MoO_3$), tungsten oxide ($WO_3$), vanadium oxide ($V_2O_5$), and nickel oxide (NiO). HTLs may also include doped organic polymeric materials such as polyethylenedioxythiophene:polystyrene sulfonate (PEDOT:PSS).

FIGS. 1 and 1A-1E, are diagrams illustrating fabrication of a device comprising charge selective transport layers for example embodiments of the present disclosure. As shown generally at 150, an exemplary structure begins with a substrate 110. The substrate material 110 can be any one or more of a number of substrates suitable for deposition of a conducting film. In some embodiments, the substrate comprises one or more of a glass, ceramic, plastic and other organic polymers, semiconductor material, a silicon wafer or other wafer material, or similar materials. In other embodiments, the substrate itself may comprise a photovoltaic cell. Examples of organic polymers, like plastics, include, but are not limited to polyesters such as polyethylene terephthalate (PET) and polyethylene naphthalate (PEN).

Referring next to 152, a first conductor layer 112 is deposited onto the substrate 110. The first conductor layer 112 can be any one or more of a number of conducting materials suitable for collecting charge. In some embodiments, first conductor layer 112 comprises a transparent conductor. For example, such a transparent conductor may be implemented using a transparent conducting oxide (TCO), which may include one or more doped metal oxides with considerable conductivity. In one exemplary embodiment, the first conductor layer 112 comprises a doped TCO such as indium tin oxide (ITO). In other embodiments, other materials suitable for fabricating a conductor layer may comprise metal oxides including one or more of many doped metal oxides, including but not limited to: gallium-doped zinc oxide (GZO), indium-doped zinc oxide (IZO), tin-doped indium-oxide (TIO), aluminium-doped zinc-oxide (AZO), indium-doped cadmium-oxide, fluorine-doped tin-oxide (FTO), and combinations thereof.

In certain embodiments, the first conductor layer 112 can include one or more non-oxide conducting materials, including but not limited to: silver nanowire or carbon nanotube meshes; continuous graphene sheets or small overlapping graphene sheets; highly doped organic semiconducting polymers, including but not limited to poly(ethylenedioxythiophene):poly(styrene sulfonate) (PEDOT:PSS); and TCO nanoparticle films; or any combination thereof.

In some implementations, the first conductor layer 112 may be employed as a conducting material deposited on top of the substrate 110 (such as shown at 152) or the first conductor layer 112 may be a layer of conductive material embedded within the substrate 110. In still other implementations, the first conductor layer 112 may comprise a layer that is adjacent to the region where the precursor solution 114 is deposited.

Referring next to 154, a precursor solution 114 is deposited onto one or both of substrate 110 and first conductor layer 112. Precursor solution 114 is deposited in such a way as to facilitate the electrical coupling of what will become the electron transport layer to the first conductor layer 112. Some embodiments may optionally include one or more intervening layers (such as a conducting buffer material layer) between the deposited precursor solution 114 and the first conductor layer 112. In such embodiments, the resulting charge selective transport layer will be electrically coupled to the first conductor layer through the buffer material layer.

The precursor solution 114 is a solution that comprises a metal-containing reactive precursor material that has been mixed with a complexing solvent. As used herein, a metal containing reactive precursor material is a reactive precursor material which includes compounds having a metal atom, M, which is bonded to one or more species, X. The nature of the M-X bond is such that the molecule readily reacts with water and/or oxygen in an ambient environment in such a way as to convert the M-X bond to a M-O bond, where O represents an oxygen atom, and the H represents a hydrogen atom. This reaction may be represented by: $M\text{-}X_n + H_2O/O_2 \rightarrow M\text{-}O_n(H)$. The O atom may be, but does not necessarily need to be, bonded to a hydrogen atom, H. For example, the metal containing reactive precursor may comprise a pyrophoric precursor material, but it need not be pyrophoric. The complexing solvent serves to stabilize the reactive metal-containing precursor material, mitigating its reactive nature, enabling the handling of the precursor solution in ambient environments containing oxygen and water without compromising the integrity of the precursor material. The precursor material will not react with oxygen or water, and instead will remain complexed with the solvent, over an extended period of time (commonly referred to as the 'shelf-life' of the precursor material). For example, in one embodiment, the precursor solution 114 may contain a pyrophoric precursor material that is stabilized by dissolving it in a complexing solvent under mild conditions. That is, for such embodiments the precursor solution 114 can be handled at room temperature under normal atmospheric conditions because the complexing solvent renders the solution non-pyrophoric. Utilizing such a precursor solution eliminates the need to provide rigorous oxygen and water-free environments, significantly reducing costs.

Precursor solution 114 in some embodiments may include an organometallic or a fully inorganic metal material, such as a metal organic (for example, organozinc), metal inorganic (for example, metal halide), metal hydroxide, metal oxide, or any combination thereof, containing for example zinc and/or titanium. In some embodiments, the reactive metal-containing precursor material is diethylzinc, while in other cases it is dimethylzinc.

A complexing solvent, as the term is used herein, is defined as a solvent wherein the constituent molecules are capable of donating electron density, generally in the form of an electron lone pair, to an electron deficient molecule, such as in a reactive metal-containing precursor material, thus stabilizing it. In such a case, the complexing solvent generally donates the electron density directly to the otherwise electron-deficient metal atom. Examples of complexing solvents include, but are not limited to, diethyl ether, tetrahydrofuran, and diglyme. Other complexing solvents such as, but not limited to, pyridine, acetonitrile, tetramethylethylenediamine, methylpyrrolidone, and dimethyl sulfoxide may also be used.

Several methods are available for applying a precursor solution onto the preceding layers of the device that avoids any need for high vacuum and high temperature deposition techniques. These methods include, but are not limited to: slot-die coating, spin-casting, drop-casting, dip-coating, knife coating, spray-coating, ink-jet printing, screen printing, Mayer rod coating, Gravure coating, Flexo printing, or curtain coating.

For example, in some embodiments precursor solution 114 is deposited onto the substrate 110 and first conductor layer 112 via spin-casting. The thickness of the resulting electron-transport layer 116 can be controlled by adjusting the concentration of the precursor in the complexing solvent, and by controlling the spin speed. In some embodiments, the precursor solution 114 is deposited onto the substrate 110 and first conductor layer 112 by using a technique that is compatible with high-throughput roll-to-roll manufacturing, such as slot-die coating. In that case, the thickness of the electron transport layer 116 can be controlled by adjusting the concentration of the precursor in the complexing solvent, by controlling the web speed, and/or by controlling the flow rate at which the precursor solution 114 is provided into the process.

Referring next to 156, the precursor solution 114 is annealed resulting in the formation of an electron transport layer 116, as shown generally at 158. Depending on the nature of the reactive metal-containing precursor material and the target metal, the annealing step can vary in both temperature and time, but due to the reactive nature of the precursor material, the conversion process is generally accomplished at low temperatures that are compatible with a wide variety of substrate and conductor materials. That is, at the temperatures applied, the annealing does not result in adverse degradation of the substrate, conductor or any other prior layer. Both the time and temperature of the annealing can be tailored to the materials utilized.

In some embodiments, annealing can occur for a period of time ranging from about 1 minute to about 15 minutes. In other embodiments, the annealing can occur at a temperature ranging from about 100° C. to about 120° C., which is advantageous for use with sensitive substrate materials, such as polymer substrates in high-throughput roll-to-roll manufacturing conditions, or in the case of sensitive first conductor materials. In yet other embodiments, the annealing can occur at a temperature ranging from 100-300° C. It should be considered within the skill of one of ordinary skill in the art who has studied the teachings of this disclosure to choose appropriate annealing times and temperatures for the particular precursor, substrate and conductor layer materials they have selected.

In FIG. 1, the electron transport layer 116 is positioned between the first conductor layer 112 and an active layer 118. Exemplary embodiments of the electron transport layer 116 may have a thickness between 25-200 nm. In the laboratory, exemplary embodiments such as those described herein have shown uniformity of the films produced to be at least 90% over large areas. It should be noted that the resulting electron transport layer 116 in some embodiments will comprise the same base materials as a transparent conductor. For example, a ZnO electron transport layer may be formed onto a doped ZnO transparent conductor, such as aluminium-doped zinc oxide (AZO).

Figure 1A:
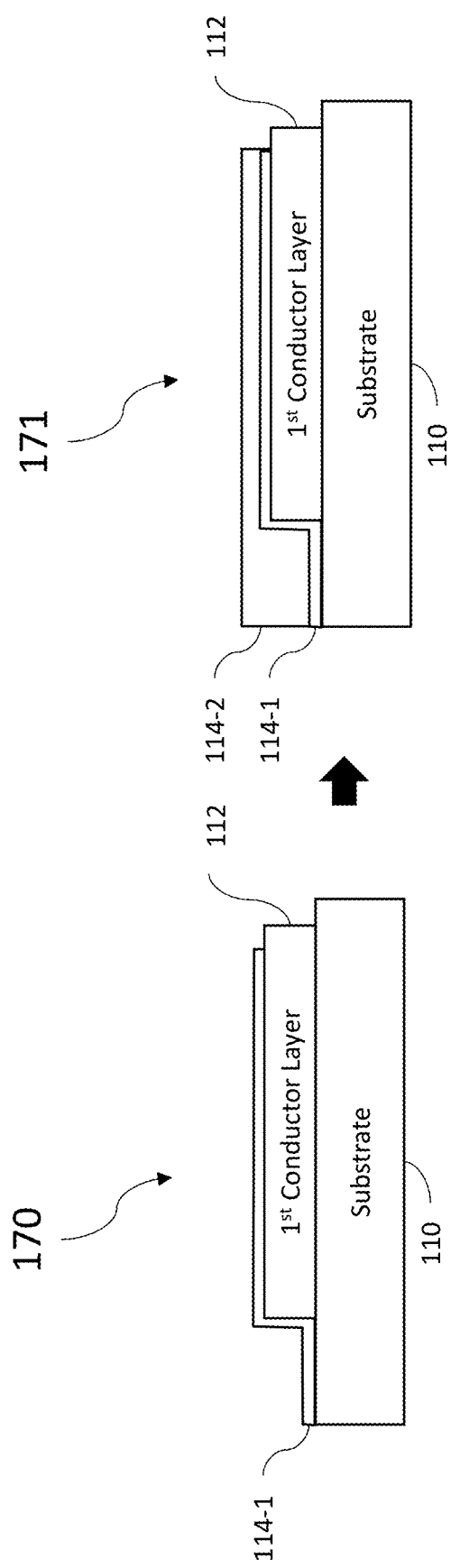
Figure 1B:
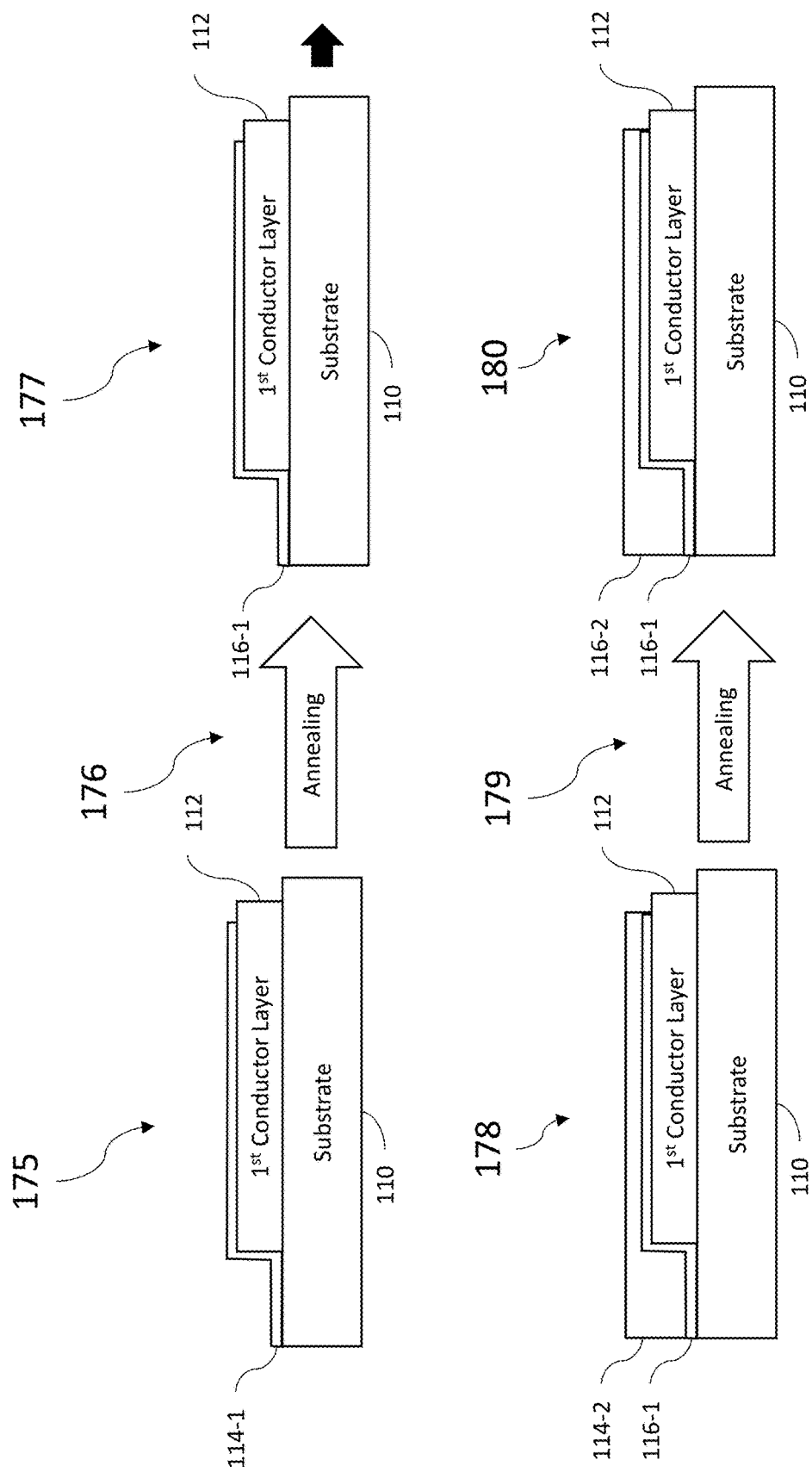

FIGS. 1A and 1B provide illustrations of alternate implementations of the process illustrated in FIG. 1 where one or both of the precursor depositions shown at 154 and the annealing shown at 156 are performed through two are more interactive steps.

For example, referring to FIG. 1A, an alternate embodiment is illustrated at 170 and 171 where the precursor solution 114 is deposited as a first precursor solution layer 114-1 followed by deposition of at least one subsequent precursor solution layer 114-2. Although FIG. 1A illustrates two precursor layers (114-1 and 114-2), any number of multiple depositions may be performed to form any number of precursor solution layers. The plurality of precursor solution layers are then annealed at 156 to form the electron transport layer 116.

In FIG. 1B another embodiment is illustrated where precursor deposition and annealing steps are alternated to form electron transport layer 116. That is, a first precursor solution layer 114-1 is deposited as shown generally at 175. This is followed by an annealing step (shown at 176), which forms a first layer 116-1 of material for the electron transport layer 116 (shown at 177). Then a second precursor solution layer 114-2 is deposited on top of the previously formed electron transport material 116-1 as shown generally at 178. This is followed by another annealing step (shown at 179), which forms a second layer 116-2 of material for the electron transport layer 116 (shown at 180). Multiple iterations of these alternating deposition and annealing steps may be performed until an electron transport layer 116 of the desired thickness is achieved.

Forming the electron transport layer 116 through multiple depositions of precursor material, as shown by either FIG. 1A or 1B, has the benefit of avoiding pinhole voids that otherwise may form and penetrate completely through the electron transport layer 116. Conductive materials from later applied layers can enter these pinholes degrading the effectiveness of electron transport layer 116 in blocking hole transport. When such pinholes occur, they do so with a random distribution with respect to the upper surface of the layer 116. Deposition of layer 116 in multiple passes (either as shown in FIG. 1A or 1B) results in different sub-layers of the electron transport layer 116 with different randomly located pinholes, substantially reducing the probability of any pinhole completely penetrating through the entirety of electron transport layer 116.

As shown in FIG. 1 at 160, once formation of the electron transport layer 116 is completed, subsequent layers may be deposited based on the desired function of the completed device. In some embodiments, the resulting device will further include an active layer 118 and a second conductor layer 120. It may also include an optional second charge selective transport layer that functions as a hole transport layer 126. To complete fabrication, in one embodiment a first conductive lead 124 is coupled to the first conductor layer 112 and a second conductive lead 122 coupled to the second conductor layer 120.

Depending on the type of device being implemented, the active layer 118 may comprise an appropriate semiconductor junction. For example, for an organic photovoltaic device (OPV) active layer 118 may comprise a heterojunction, such as a bulk or planar heterojunction, for example. For an OPV device, the materials used to fabricate active layer 118 may include, but are not limited to, poly(3-hexylthiophene): phenyl $C_{61}$ butyric acid methyl ester (P3HT:PCBM) blends, PCPDTBT:PCBM blends, Si—PCPDTBT:PCBM blends, PCDTBT:PCBM blends, PTB7:$PC_{71}$BM blends, or any combinations thereof. The second conductor layer 120 can be any one or more of a number of conducting materials suitable for collecting charge such as those mentioned for $1^{st}$ conducting layer 112. Further, either of the conductor layers 112 and 120 may comprise one or more metals including, but not limited to magnesium, silver, gold, aluminium, copper, palladium, cadmium, nickel, or zinc. Other optoelectronic devices may be implemented such as, but not limited to: inorganic thin-film PV devices and modules, organic or inorganic light-emitting diodes (LEDs), and organic or inorganic field-effect transistors (FETs).

As mentioned above, the embodiment shown in FIG. 1 at 160, further comprises a hole-transport layer 126 positioned between the active layer 118 and the second conductor layer 120. This second charge selective transport layer may be fabricated in the same way as described above for an electron transport layer, but using a second precursor solution having a different selection of metal containing reactive precursor material and a complexing solvent appropriate for that material. For example, a precursor solution for a hole transport layer may be prepared by dissolving a metal containing reactive precursor material, such as one containing nickel. This precursor solution may be deposited onto an active layer and annealed into a nickel oxide (NiO) hole transport layer. A number of other materials can also be used to provide a hole transport layer, including but not limited to such metal oxides as: molybdenum oxide ($MoO_3$), tungsten oxide ($WO_3$), and vanadium oxide ($V_2O_5$).

Figure 1C:
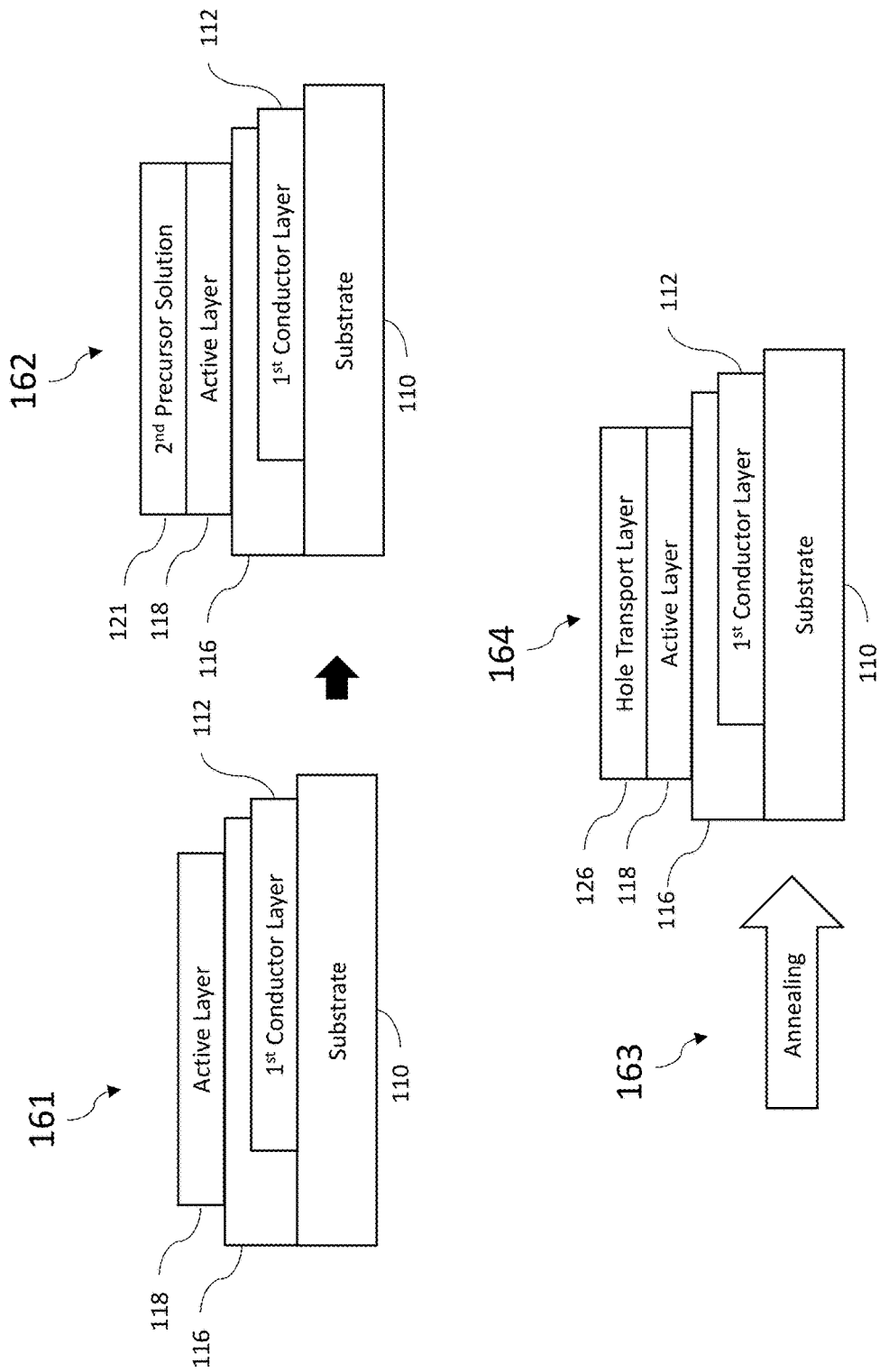

As illustrated in FIG. 1C, after deposition of the active layer 118 (shown at 161), the second precursor solution 121 is deposited onto the surface of the active layer 118 (shown at 162). Any of the solution deposition methods described above for the first precursor material 114 may be utilized to deposit the second precursor material 121, again avoiding the need for high vacuum or high temperature deposition techniques to create this layer. The second precursor solution 121 is then annealed (shown at 163) to form a hole transport layer 126 (shown at 164). The second conductor layer 120 would then be deposited on the hole transport layer 164 and used to electrically couple an anode for the device to the active layer 118.

Figure 1D:
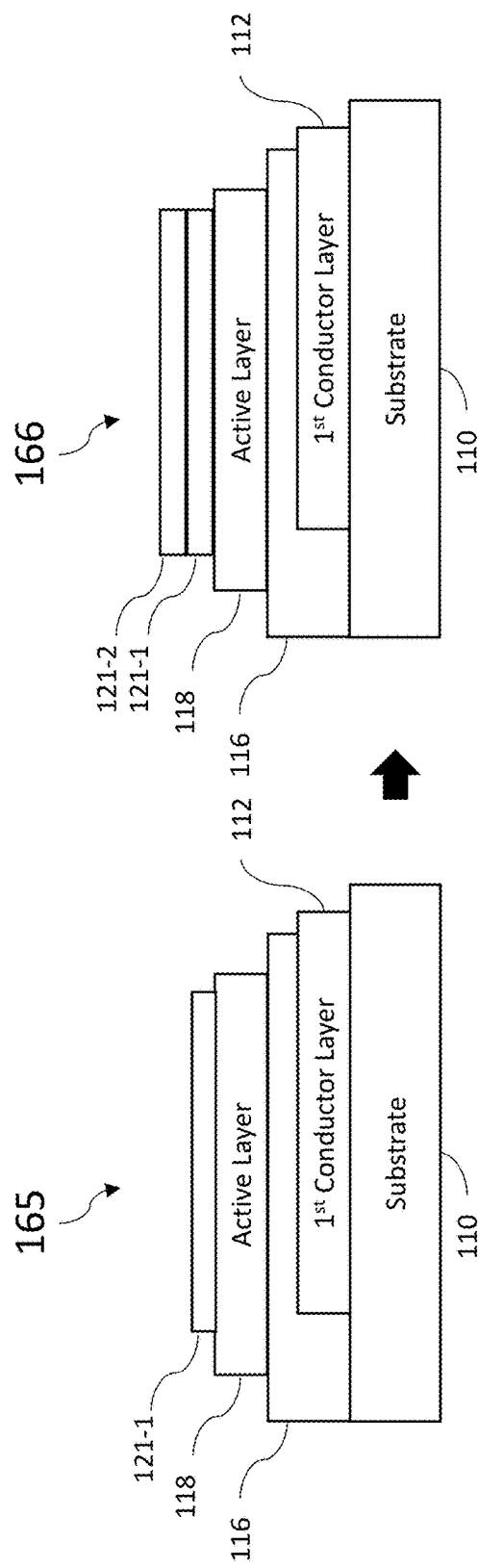
Figure 1E:
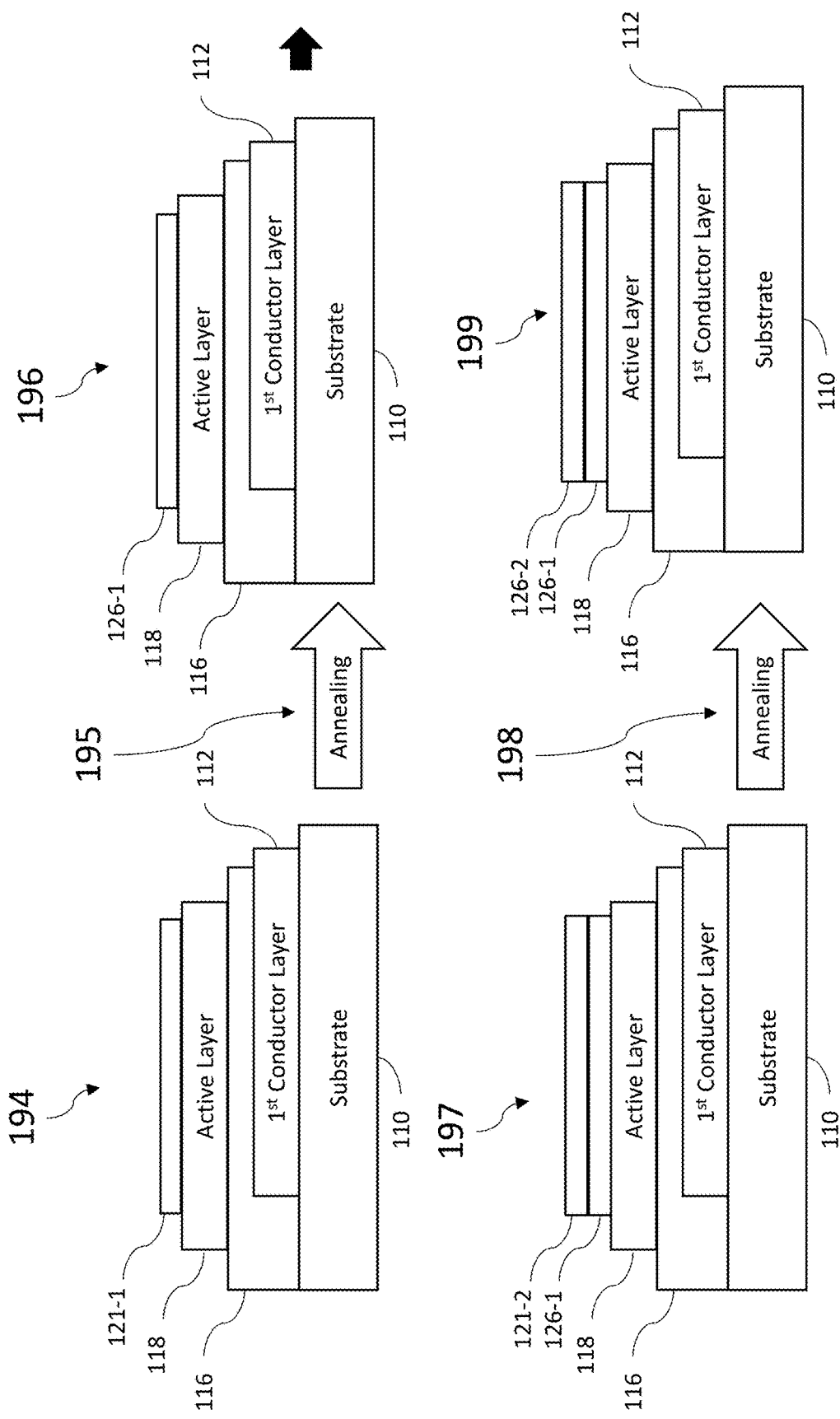

FIGS. 1D and 1E provide illustrations of alternate implementations of the process illustrated in FIG. 1C where one or both of the second precursor depositions shown at 162 and the annealing shown at 163 are performed through two or more interactive steps.

For example, referring to FIG. 1D, an alternate embodiment is illustrated at 165 and 166 where the precursor solution 121 is deposited as a first precursor solution layer 121-1 followed by deposition of at least one subsequent precursor solution layer 121-2. Although FIG. 1D illustrates two precursor layers (121-1 and 121-2), any number of multiple depositions may be performed to form any number of precursor solution layers. The plurality of precursor solution layer are then annealed at 163 to form the hole transport layer 126.

In FIG. 1E another embodiment is illustrated where precursor deposition and annealing steps are alternated to form hole transport layer 126. That is, a first layer of the second precursor solution 121-1 is deposited as shown generally at 194. This is followed by an annealing step (shown at 195), which forms a first layer 126-1 of material that will form the hole transport layer 126 (shown at 196). Then a second layer of the second precursor solution 121-2 is deposited on top of the previously formed hole transport material 126-1 as shown generally at 197. This is followed by another annealing step (shown at 198), which forms a second layer 126-2 of material for the hole transport layer 126 (shown at 199). Multiple iterations of these alternating deposition and annealing steps may be performed until a hole transport layer 116 of the desired thickness is achieved.

As discussed with respect to the electron transport layer 116, forming the hole transport layer 126 through multiple depositions of precursor material, as shown by either FIG. 1D or 1E, has the benefit of avoiding pinhole voids that otherwise may form and penetrate completely through the hole transport layer 126. Deposition of layer 126 in multiple passes (either as shown in FIG. 1D or 1E) results in different sub-layers of the hole transport layer 126 with different randomly located pinholes, substantially reducing the probability of any pinhole completely penetrating through the entirety of hole transport layer 126.

In different embodiments, the ETL and HTL layers produced as described above can be used in other optoelectronic devices, including but not limited to: inorganic thin-film PV devices and modules, organic or inorganic light-emitting diodes (LEDs), and organic or inorganic field-effect transistors (FETs).

Figure 2:
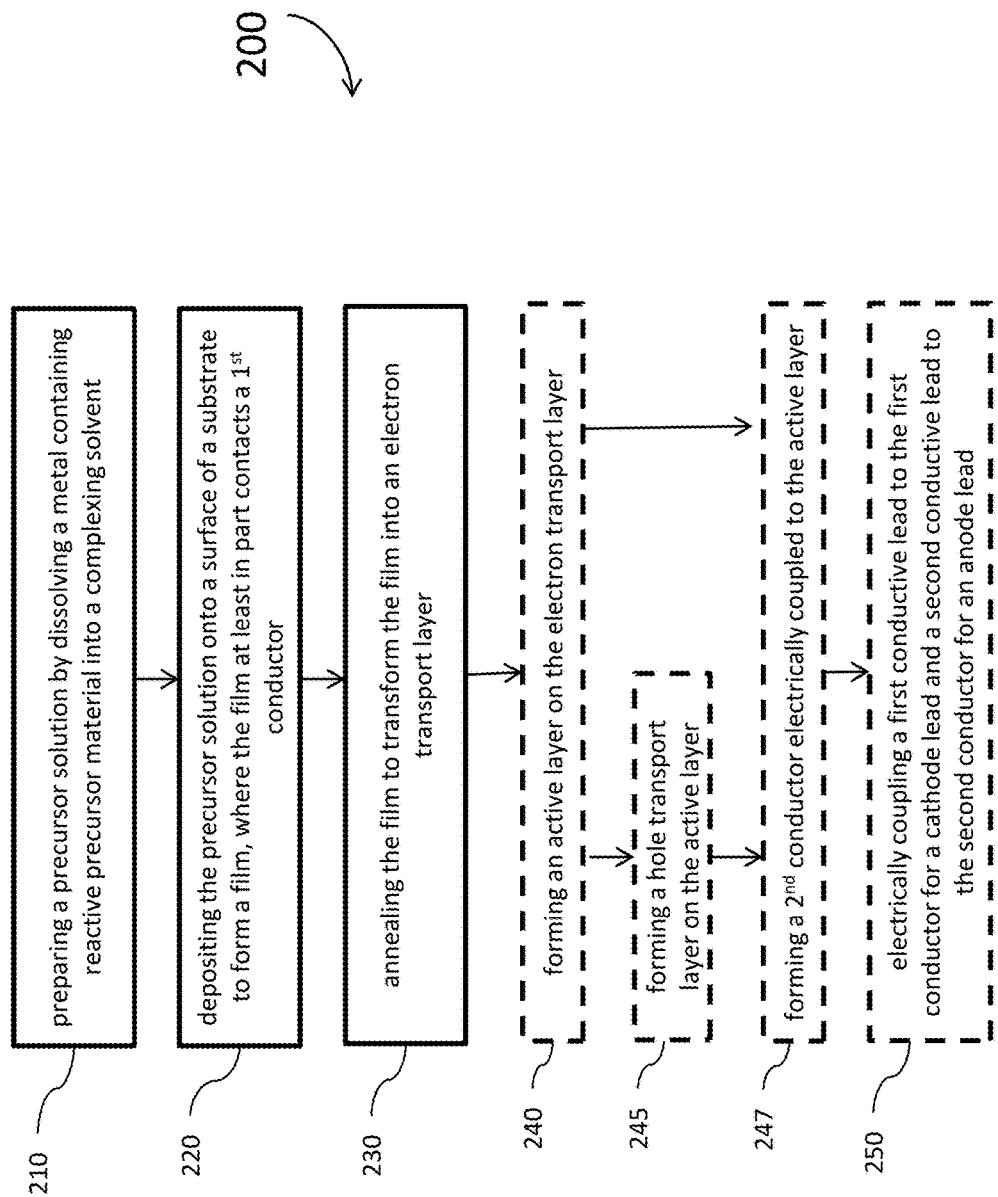
FIGS. 2 and 2A-2E illustrate methods for producing a charge selective transport layer of one example embodiment of the present disclosure.

FIG. 2 is flow chart illustrating a method 200 for fabricating a charge selective transport layer via one embodiment of the present disclosure. In one embodiment, the method of FIG. 2 is utilized in conjunction with fabrication of a photovoltaic device such as the one described above with respect to any of FIGS. 1 and 1A-1E.

Method 200 begins at 210 with providing a precursor solution that comprises a metal containing reactive precursor material dissolved into a complexing solvent. As explained above, the metal containing reactive precursor material is a reactive precursor material which includes compounds having a metal atom, M, which is bonded to one or more species, X. The nature of the M-X bond is such that the molecule readily reacts with water and/or oxygen in an ambient environment to convert the M-X bond to a M-O bond. The O atom may be, but does not necessarily need to be, bonded to a hydrogen atom, H. For example, the metal containing reactive precursor material may comprise a pyrophoric precursor material, but it need not be pyrophoric. Also as described above, the complexing solvent is a solvent where constituent molecules are capable of donating electron density, generally in the form of an electron lone pair, to an electron deficient molecule. Examples of complexing solvents which may be used at 210 include, but are not limited to: diethyl ether, tetrahydrofuran (THF), and diglyme, pyridine, acetonitrile, tetramethylethylenediamine, methylpyrrolidone, and dimethyl sulfoxide. Such combinations of a metal containing reactive precursor material with a complexing solvent may be used to form the precursor solution 114 shown in FIG. 1.

In one example embodiment, a ZnO electron transport layer is fabricated from a metal containing reactive precursor material such as diethylzinc dissolved into the complexing solvent THF. In one implementation of such an embodiment, a 10 mL of a 15 wt. % solution of diethylzinc in toluene is mixed with 50 mL of THF in the absence of water and oxygen to produce a precursor solution of 2.5 wt. % diethylzinc/THF/toluene solution. In one alternate implementation, the diethylzinc can be mixed directly with THF, without the use of a toluene solution, in the absence of water and oxygen, to produce a precursor solution of 2.5 wt. % diethylzinc/THF solution. Either of such precursor solutions may be used, for example, for formulating precursor solution 114.

Method 200 proceeds to 220 with depositing the precursor solution onto a surface of a substrate to form a film. In one embodiment, the film at least in part contacts a first conductor. As discussed above, the first conductor's ultimate purpose is to conduct electrons received from the electron transport layer that will be created from the precursor solution. As such, the precursor solution is deposited in such a way as to facilitate the electrical coupling of the electron transport layer with the first conductor. In one embodiment, the first conductor comprises a conductor layer deposited on top of a substrate surface. FIG. 1 illustrates one such embodiment at 154 where first conductor layer 112 is deposited on top of substrate 110. In other implementations, the conductor layer may be a layer of conductive material embedded within the substrate. In still other implementations, the first conductor may comprise a layer that is adjacent to the region where the precursor solution is deposited. Further, in some embodiments, one or more intervening layers may exist between the deposited precursor solution 114 and the first conductor. However, in such embodiments, the one or more intervening layers either are, or will become, conductive layers that will establish electrical coupling between the electron transport layer and the first conductor. For example, the one or more intervening layers may comprise a buffer layer that indirectly couples the electron transport layer to the first conductor.

Examples of deposition methods which may be used at 220 include, but are not limited to, slot-die coating, spin-casting, drop-casting, dip-coating, knife coating (also known as doctor blading), spray-coating, ink-jet printing, screen printing, Mayer rod coating (also known as metering rod coating), Gravure coating, Flexo printing, and curtain coating. The particular method used may be selected based on its compatibility with other manufacturing processes being used. For example, in one implementation, the precursor solution is deposited using a technique that is compatible with high-throughput roll-to-roll manufacturing, such as slot-die coating. In that case, the thickness of the electron transport layer can be controlled, for example, by varying the concentration of the metal containing reactive precursor material mixed with the complexing solvent, by controlling the web speed and/or the flow rate at which the precursor solution is applied to the substrate.

Method 200 proceeds to 230 with annealing the film to transform the precursor film into an electron transport layer. Such annealing is represented in FIG. 1 generally at 156 to form the electron transport layer 116 shown generally at 158 and 160. Both the time and temperature of annealing at 230 may be controlled so as to not adversely affect the substrate material or other previously deposited materials. Depending on the particular material used, typical annealing can be achieved within a period of time ranging from about 1 minute to about 15 minutes and temperatures ranging from about 100° C. to about 120° C. Such duration and temperatures would, for example, be advantageous for use with substrates, such as polymer substrates used in high-throughput roll-to-roll manufacturing conditions. However, when the particular materials permit, annealing can be performed at a temperature ranging from 100-300° C.

In the above-mentioned embodiment where method 200 is utilized to produce a ZnO electron transport layer, the depositing performed at 220 may comprise slot-die coating of the precursor solution. For example, in one implementation, the precursor solution produced from the diethylzinc and THF is slot-die coated onto the substrate at room temperature, in normal ambient atmosphere, to form a film. The resulting thin film, which will include zinc oxides and hydroxides, is annealed at 230, at a temperature of 100° C. for 5 minutes to produce an electron transport layer comprising a ZnO thin film. Slot-die coating of such ZnO thin films from stabilized diethylzinc solutions on substrates as large as 6"×6" have produced very high quality thin and uniform films, which demonstrates the potential for very large area roll-to-roll fabrication. Optical profilometry of such films show very smooth films with root-mean-squared surface roughness (Rq) values of ~1.65 nm. The thickness of the ZnO thin film electron transport layer can be varied depending on the precursor concentration (1-10 wt. %), solution flow rate (0.1-5 mL/min), and coating speed (0.5-5 m/min), with typical thickness values of 25-200 nm, as determined via stylus profilometry. The uniformity of the films produced has been estimated via UV-visible absorption mapping to be as high as 90% over large areas. The work function of the ZnO produced has been measured to be between 4.0 and 4.5 eV by Kelvin probe (referenced to a gold film).

Forming the electron transport layer 116 through multiple depositions of precursor material, as shown by either FIG. 1A or 1B, has the benefit of avoiding pinhole voids that otherwise may form and penetrate completely through the electron transport layer 116. Conductive materials from later applied layers can enter these pinholes degrading the effectiveness of electron transport layer 116 in blocking hole transport. When such pinholes occur, they do so with a random distribution with respect to the upper surface of the layer 116. Deposition of layer 116 in multiple passes (either as shown in FIG. 1A or 1B) results in different sub-layers of the electron transport layer 116 with different randomly located pinholes, substantially reducing the probability of any pinhole completely penetrating through the entirety of electron transport layer 116.

Figure 2A:
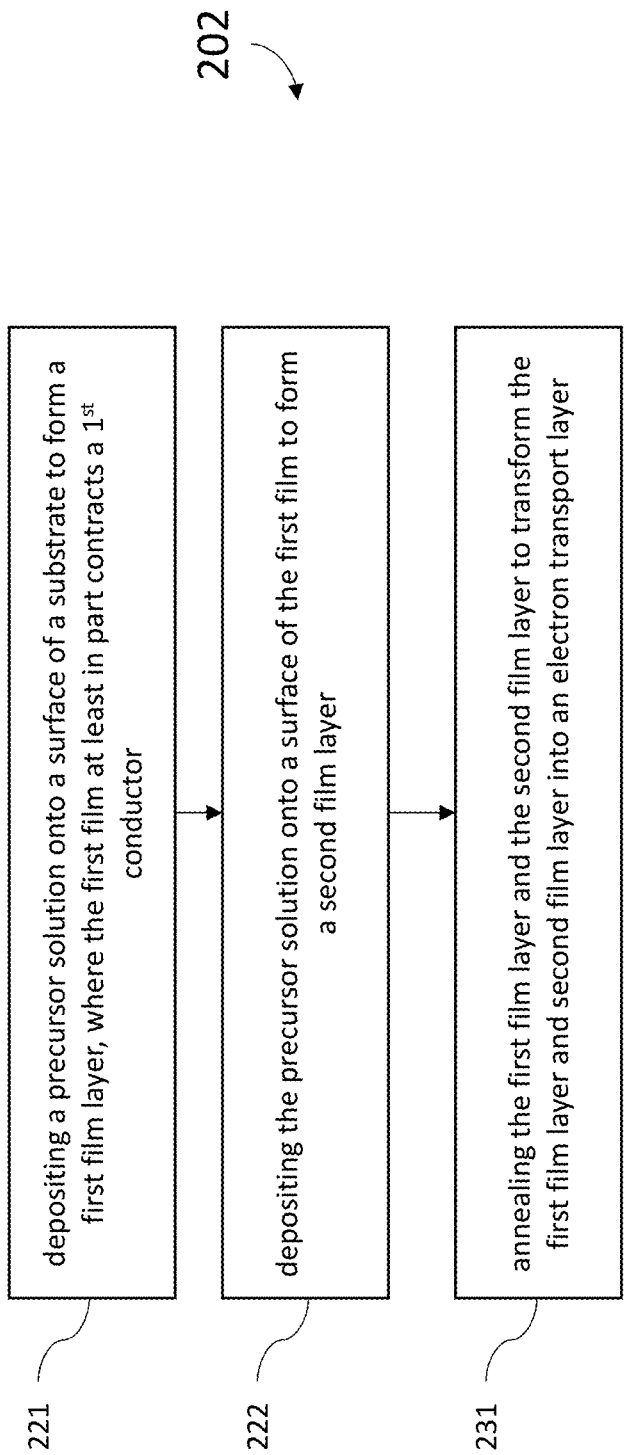
Figure 2B:
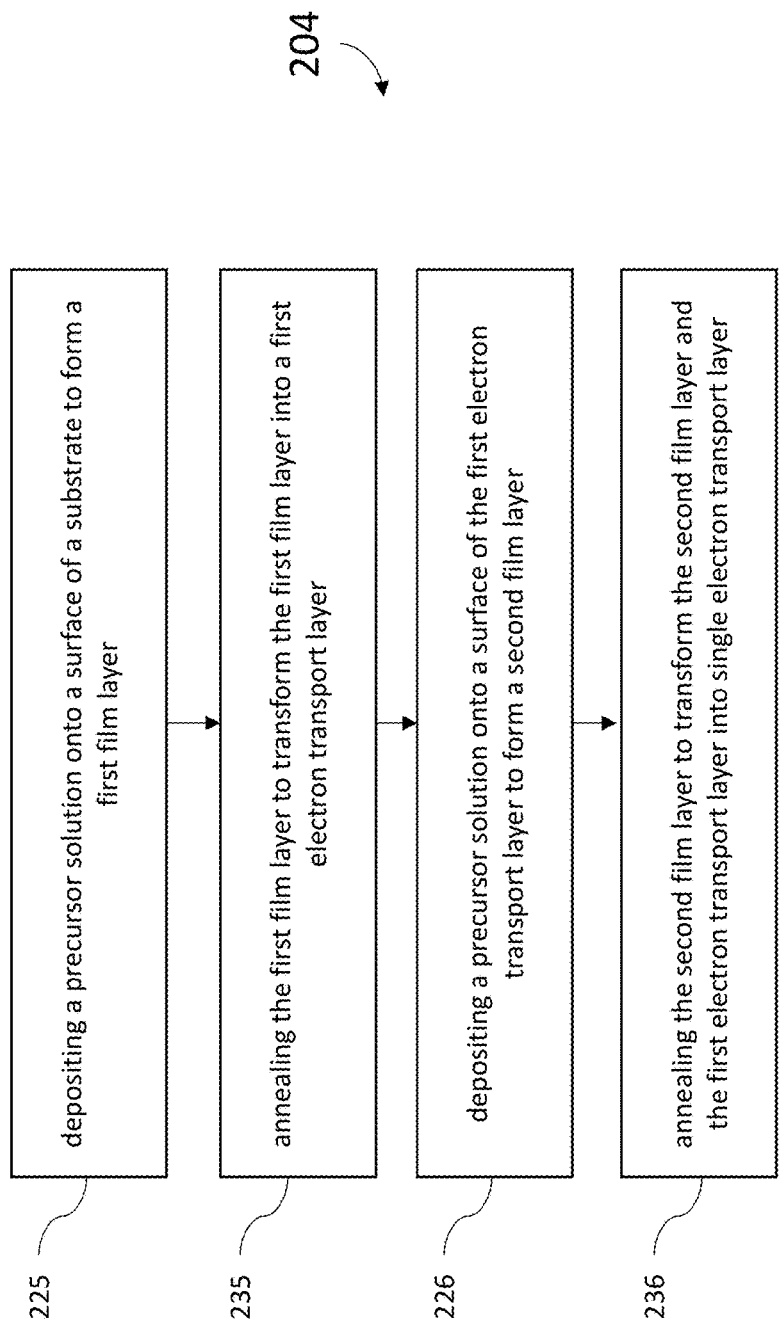

FIGS. 2A and 2B provide illustrations of alternate implementations of the process illustrated in FIG. 2 where one or both of the precursor deposition shown at 220 and the annealing shown at 230 are performed through two are more interactive steps. Forming a charge selective transport layer through multiple depositions of precursor material, as shown by either FIG. 2A or 2B or elsewhere in this description, has the benefit of avoiding pinhole voids that otherwise may form an penetrate completely through the electron transport layer for the reasons previously described above.

For example, referring to FIG. 2A, an alternate embodiment is illustrated at 202 where the deposit of block 220 and annealing at block 230 are further defined. In this embodiment, 221 comprises depositing a precursor solution onto a surface of a substrate to form a first film layer, where the first film at least in part contracts a $1^{st}$ conductor. The process then proceeds to 222 with depositing the precursor solution onto a surface of the first film to form a second film layer. The process then proceeds to 231 with annealing the first film layer and the second film layer to transform the first film layer and second film layer into an electron transport layer. It would be appreciated that depositing one or more additional layers of the precursor solution onto the previously deposited precursor solutions may be performed before proceeding to 231. The plurality of precursor solution layers are then annealed at 231 to form the electron transport layer.

In FIG. 2B another embodiment is illustrated where precursor deposition (block 220) and annealing (block 230) steps are alternated to form the electron transport layer. That is, a first deposition is shown generally at 235 with depositing a precursor solution onto a surface of a substrate to form a first film layer. This deposition may lay the first film so that it at least in part contracts a $1^{st}$ conductor, or it may be deposited on an intervening layer that provides a conductive path to the $1^{st}$ conductor. The method proceeds with annealing the first film layer to transform the first film layer into a first electron transport layer at 235. Then another layer of precursor solution is applied and annealed. At 226, the process proceeds with depositing a precursor solution onto a surface of the first electron transport layer to form a second film layer and then to 236 with annealing the second film layer to transform the second film layer and the first electron transport layer into single electron transport layer. Multiple iterations of these alternating deposition and annealing steps may be performed until an electron transport layer of the desired thickness is achieved.

Also as shown in FIG. 2, method 200 may further comprise one or more additional steps to achieve various optional or alternate embodiments for specific applications. For example, in one embodiment, method 200 proceeds to 240 with forming an active layer on the electron transport layer. The particular materials for forming the active layer are selected based on the desired function of the device as already described above for active layer 118 and apply to this method, and as such are not repeated here in detail.

Regardless of the particular application, the placement of the electron transport layer between the active layer and the first conductor will result in a device where electrons are permitted to flow from the active layer to the first conductor, but holes are not, so that an electrical lead coupled to the first conductor will function as the cathode lead for the device (such as mentioned at 250). In one embodiment (illustrated at 247), a second conductor is electrically coupled to the active layer such that an electrical lead coupled to the second conductor will function as the anode lead for the device (such as mentioned at 250). Further, in one embodiment illustrated by 245, a hole transport layer is formed on the active layer prior to the second conductor (such as hole transport layer 126 shown in FIG. 1). Analogous in function to the electron transport layer, the placement of a hole transport layer between the active layer and the second conductor will result in a device where hole current is permitted to flow from the active layer to the second conductor, but electrons are not.

Figure 2C:
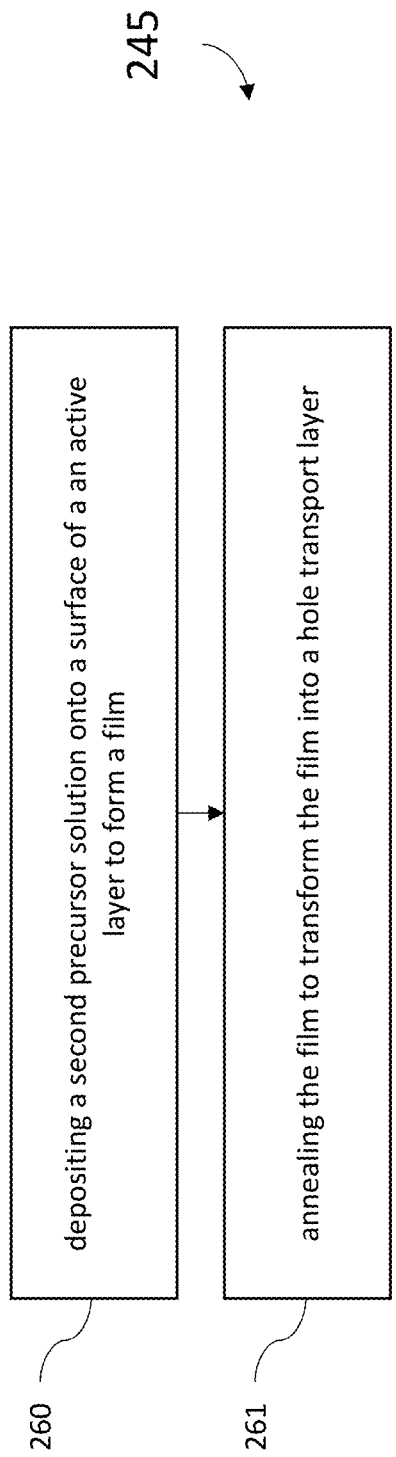

As shown in FIG. 2C, the forming of the hole transport layer is consistent with the process described above with respect to FIGS. 1 and 1A-1E. In one embodiment, the step at 260 comprises depositing a second precursor solution onto a surface of an active layer to form a film. This is followed at 261 with annealing the film to transform the film into a hole transport layer. Also as shown in FIGS. 2D and 2E, the deposition and annealing can be subdivided into interactive steps.

Figure 2D:
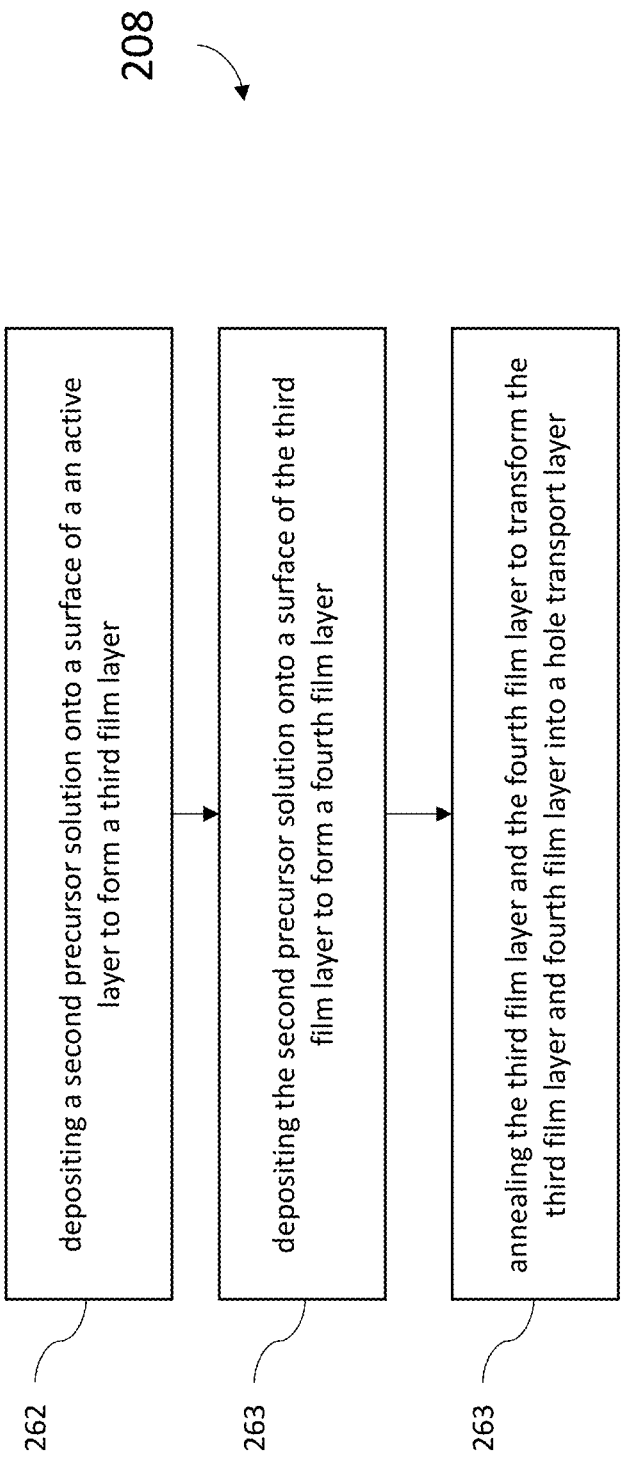
Figure 2E:
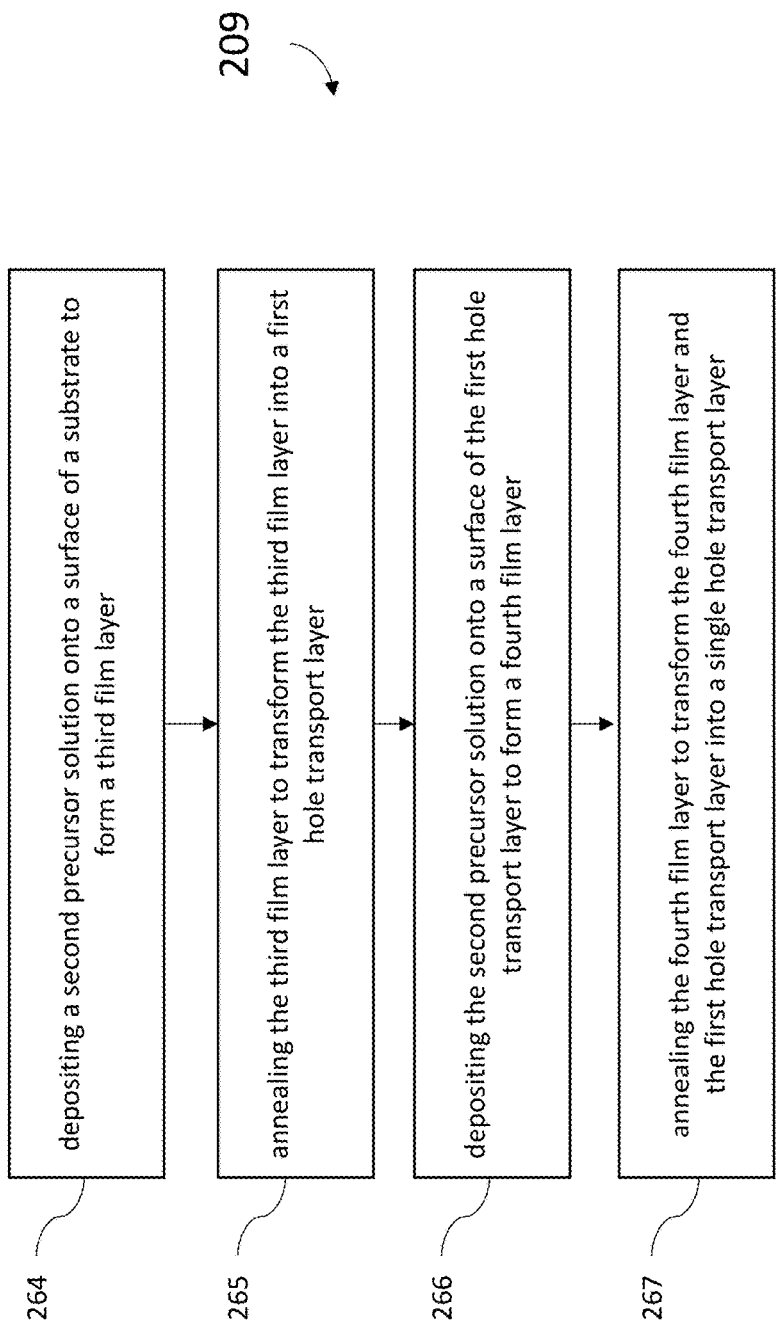

In FIG. 2D at 208, the process may comprise depositing a second precursor solution onto a surface of an active layer to form a third film layer (at 262), depositing the second precursor solution onto a surface of the third film layer to form a fourth film layer (at 263) and annealing the third film layer and the fourth film layer to transform the third film layer and fourth film layer into a hole transport layer (at 264, FIG. 2E). It would be appreciated that depositing one or more additional layers of the precursor solution onto the previously deposited precursor solutions may be performed before proceeding to 264. The plurality of precursor solution layers is then annealed at 264 to form the electron transport layer.

In FIG. 2E another embodiment is illustrated at 209 where precursor deposition and annealing steps are alternated to form the hole transport layer. That is, a first deposition is shown generally at 264 with depositing the second precursor solution onto a surface of a substrate to form a third film layer. This deposition may lay the third film layer so that it at least in part contracts the previously deposited active layer, or it may be deposited on an intervening layer that provides a conductive path to the active layer. The method proceeds with annealing the first film layer to transform the third film layer into a first hold transport layer at 265. Then another layer of the second precursor solution is applied and annealed. At 266, the process proceeds with depositing the second precursor solution onto a surface of the first hole transport layer to form a fourth film layer and then to 267 with annealing the fourth film layer to transform the fourth film layer and the first hole transport layer into a single hole transport layer. Multiple iterations of these alternating deposition and annealing steps may be performed until a hole transport layer of the desired thickness is achieved.

Figure 3:
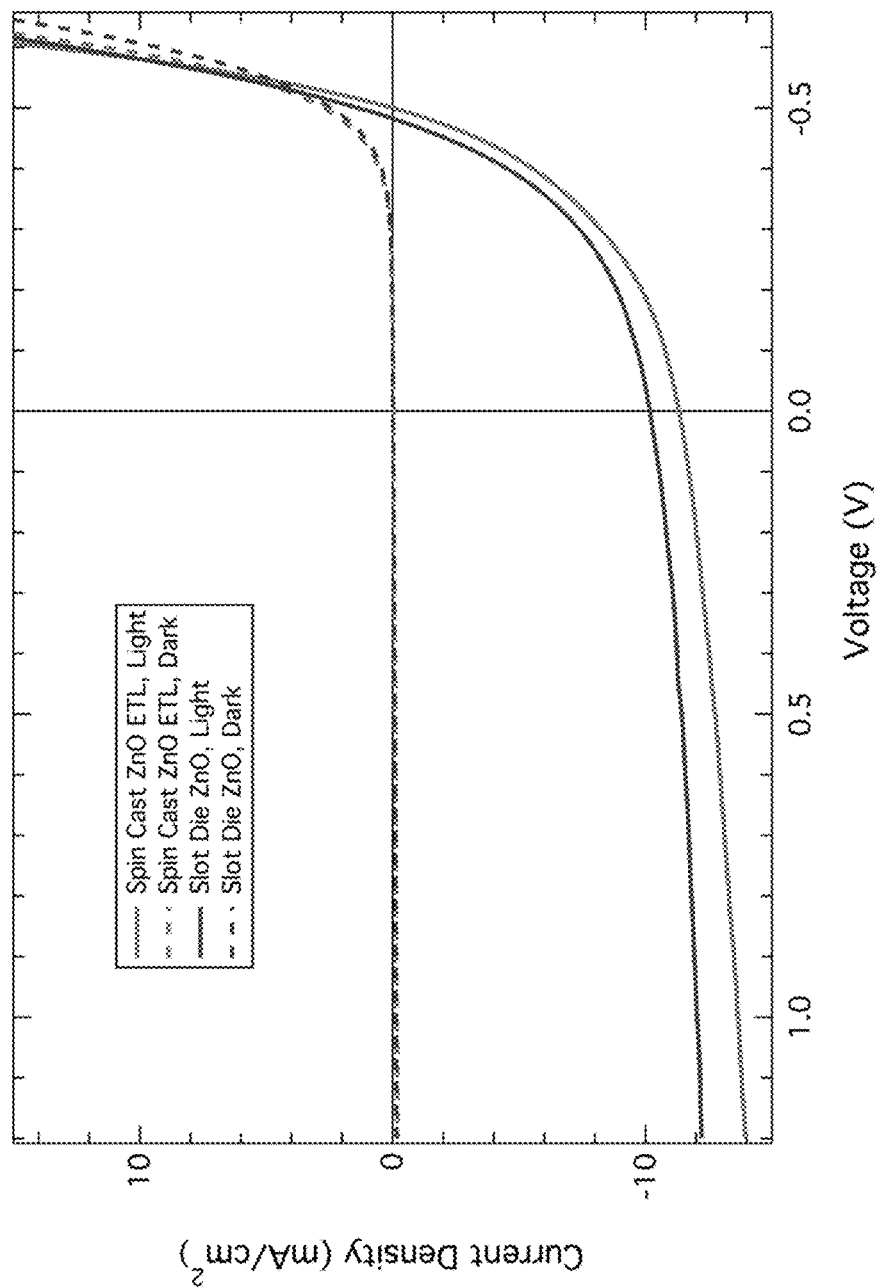
FIG. 3 is a graph of current density vs. voltage comparing spin-cast vs. slot-die coated zinc oxide ETL according to exemplary embodiments disclosed in the present disclosure.

In alternate embodiments, one or both of the first conductor and the second conductor may be implemented as transparent conductor layers. For example, in one example embodiment where the ZnO electron transport layer is produced from 230, a single-cell photovoltaic device may be produced by coating the electron transport layer with an active layer that provides a bulk heterojunction (BHJ) solution, followed by a hole-transport layer, and finally depositing a high work-function top electrode, such as silver, for the second conductor. In such devices, the electron transport layer serves to facilitate electron extraction and block hole extraction, which helps to maximize the open-circuit voltage ($V_{OC}$) from the photovoltaic device. Representative current density-voltage (J-V) traces for 0.11 cm$^2$ devices fabricated based upon such a slot-die coated ZnO electron transport layer with a P3HT:PCBM active layer and a PEDOT:PSS-based hole transport layer are shown in FIG. 3, along with average device performance characteristics in Table 1 (below), demonstrating comparable performance of a device with a spin-cast ZnO electron transport layer.

TABLE 1

| | Voc (mV) | Jsc (mA/cm$^2$) | Fill Factor | Efficiency (%) | R Shunt (Ohms) | R Rect. (Ohms) | R Series (Ohms) | Number of Suns |
|---|---|---|---|---|---|---|---|---|
| Spin-Cast ZnO | 500 | 11.3 | 44.1 | 2.53 | 6.04E+04 | 75 | 15 | 0.984 |
| Slot-Die ZnO | 482 | 10.2 | 45.3 | 2.26 | 7.91E+04 | 108 | 20 | 0.983 |

For the production of large-area modules based upon the slot-die coated ZnO electron transport layers, a ZnO electron transport layer and first conductor layer (which may be a transparent conducting oxide, like indium tin oxide (ITO)), can be patterned to permit formation of discrete cells that are then connected in either a serial or paralleled fashion to yield voltage or current addition, respectively. Examples using a convention P1, P2, P3 scribing process, a ZnO/ITO, BHJ, and PEDOT/Ag layers, respectively, can be patterned to produce a serial interconnection of cell stripes to produce modules with additive voltage.

Figure 4:
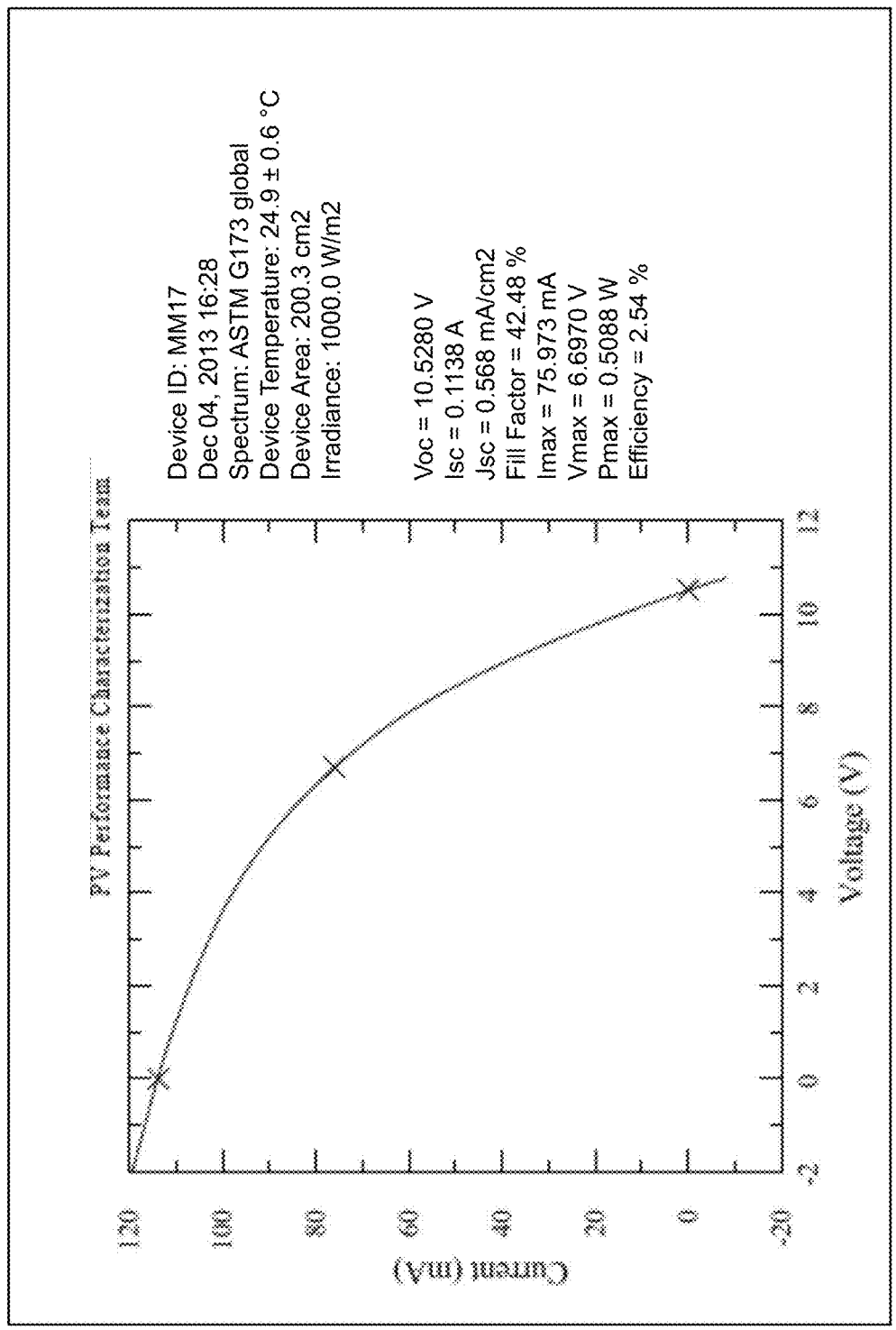
FIG. 4 is a graph illustrating the performance of a photovoltaic module of one embodiment of the present disclosure.

FIG. 4 illustrates a performance plot, certified by the National Renewable Energy Laboratory (NREL), of a large-area Organic Photovoltaic Module incorporating a Zinc Oxide electron transport layer fabricated via an embodiment of the method described herein. As demonstrated by this plot, this Zinc Oxide electron transport layer is quite suitable for use in large-area, high-performance Organic Photovoltaic Modules. The favourable $V_{oc}$ demonstrates the effective nature of the ZnO electron transport layer produced from a precursor solution comprising the stabilized diethylzinc solution, and the potential this technology has to enable low-temperature, atmospheric production of inverted-architecture OPV modules in a high-throughput roll-to-roll compatible process.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. A method comprising:
   forming a first charge selective transport layer that is electrically coupled to a first conductor layer, wherein the first charge selective transport layer is configured to selectively conduct charge carriers between a semiconductor layer and the first conductor layer; and
   forming, above the first charge selective transport layer, the semiconductor layer, wherein the first charge selective transport layer is electrically coupled to the semiconductor layer, and
   wherein forming the first charge selective transport layer comprises:
   depositing, in an ambient atmosphere, a first precursor solution comprising a first metal-containing reactive precursor material dissolved into a first complexing solvent, wherein molecules of the first complexing solvent are bonded to molecules of the first metal-containing reactive precursor material, preventing the first metal-containing reactive precursor material from reacting with water and oxygen;
   evaporating the first complexing solvent, thereby allowing the first metal-containing reactive precursor material to react with at least one of water or oxygen in the ambient atmosphere to form a first film; and
   annealing the first film, thereby chemically altering the first film to form the first charge selective transport layer.

2. The method of claim 1, wherein the first charge selective transport layer is formed on the first conductor layer.

3. The method of claim 1, wherein the first charge selective transport layer is formed on at least one intervening layer comprising a material that electrically couples the first charge selective transport layer to the first conductor layer.

4. The method of claim 1, wherein the first film forms an electron transport layer when annealed.

5. The method of claim 1, wherein the first film forms a hole transport layer when annealed.

6. The method of claim 1, further comprising:
   forming a second charge selective transport layer that is electrically coupled to the semiconductor layer, wherein the second charge selective transport layer is configured to selectively conduct charge carriers between the semiconductor layer and a second conductor layer; and
   forming, above the second charge selective transport layer, the second conductor layer, wherein the second charge selective transport layer is electrically coupled to the second conductor layer, and
   wherein forming the second charge selective transport layer comprises:
   depositing, in the ambient atmosphere, a second precursor solution comprising a second metal-containing reactive precursor material dissolved into a second complexing solvent, wherein molecules of the second complexing solvent are bonded to molecules of the second metal-containing reactive precursor material, preventing the second metal-containing reactive precursor material from reacting with water and oxygen;

evaporating the second complexing solvent, thereby allowing the second metal-containing reactive precursor material to react with at least one of water or oxygen in the ambient atmosphere to form a second film; and annealing the second film, thereby chemically altering the second film to form the second charge selective transport layer.

7. The method of claim 6, wherein the first film forms an electron transport layer when annealed, and wherein the second film forms a hole transport layer when annealed.

8. The method of claim 1, wherein the semiconductor layer comprises an active layer of a heterojunction semiconductor device.

9. The method of claim 1, wherein the first metal-containing reactive precursor material comprises diethylzinc or dimethylzinc.

10. The method of claim 1, wherein the first charge selective transport layer comprises a ZnO film or a $TiO_x$ film.

11. The method of claim 1, wherein the first complexing solvent comprises at least one of tetrahydrofuran (THF), diethyl ether, diethylene glycol dimethyl ether (diglyme), pyridine, acetonitrile, or tetramethylethylenediamine.

12. The method of claim 1, wherein depositing the first precursor solution comprises at least one of: slot-die coating, spin-casting, drop-casting, dip-coating, knife coating, spray-coating, inkjet printing, screen printing, Mayer rod coating, Gravure coating, Flexo printing, or curtain coating.

13. The method of claim 1, wherein the first conductor layer comprises a transparent conductor material.

14. The method of claim 1, wherein the first film is annealed at a temperature between about 100 degrees Celsius and about 300 degrees Celsius.

15. The method of claim 1, wherein the first film is annealed at a temperature between about 100 degrees Celsius and about 120 degrees Celsius.

16. The method of claim 1, wherein the first metal-containing reactive precursor material comprises molecules having a metal atom, M, that is bonded to one or more species, X, in an M-X bond, such that when the molecules readily react with the at least one of water or oxygen in the ambient environment, the M-X bond is converted to an M-O bond, with O representing an oxygen atom.

17. A method comprising:
forming, on a substrate, a first conductor layer of an inverted architecture organic photovoltaic device, wherein the first conductor layer comprises a transparent conductor material;

forming, an electron transport layer of the inverted architecture organic photovoltaic device that is configured to conduct electrons between an active layer of the inverted architecture organic photovoltaic device and the first conductor layer, wherein the electron transport layer comprises a transparent metal oxide; and forming, above the electron transport layer, the active layer, wherein the active layer comprises a heterojunction, and wherein forming the electron transport layer comprises:
dissolving an organometallic precursor compound in a complexing solvent to form a precursor solution, wherein molecules of the complexing solvent are bonded to molecules of the organometallic precursor compound in the precursor solution, preventing the organometallic precursor compound from reacting with water and oxygen;

coating, in an ambient atmosphere, the first conductor layer and a first portion of the substrate with the precursor solution;

evaporating the complexing solvent, thereby allowing the organometallic precursor compound to react with at least one of water or oxygen in the ambient atmosphere to produce a film; and annealing the film, thereby chemically altering the film to form the electron transport layer.

18. The method of claim 17, wherein the organometallic precursor compound comprises diethylzinc or dimethylzinc.

19. The method of claim 17, wherein the complexing solvent comprises at least one of tetrahydrofuran (THF), diethyl ether, diethylene glycol dimethyl ether (diglyme), pyridine, acetonitrile, or tetramethylethylenediamine.

20. The method of claim 17, wherein the precursor solution is coated under atmospheric conditions using a solution coating method comprising at least one of: slot-die coating, spin-casting, drop-casting, dip-coating, knife coating, spray-coating, ink-jet printing, screen printing, Mayer rod coating, Gravure coating, Flexo printing, or curtain coating.

* * * * *